(12) United States Patent
Tanaka et al.

(10) Patent No.: US 12,292,373 B2
(45) Date of Patent: *May 6, 2025

(54) OPTICAL PLASTIC FILM, AND OPTICAL LAMINATE, POLARIZATION PLATE, AND IMAGE DISPLAY DEVICE USING SAME

(71) Applicant: DAI NIPPON PRINTING CO., LTD., Tokyo (JP)

(72) Inventors: Yoshiko Tanaka, Tokorozawa (JP); Shosei Kubota, Kashiwa (JP); Takashi Kuroda, Moriya (JP); Akinobu Ushiyama, Moriya (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/537,293

(22) Filed: Dec. 12, 2023

(65) Prior Publication Data

US 2024/0110860 A1 Apr. 4, 2024

Related U.S. Application Data

(63) Continuation of application No. 17/907,433, filed as application No. PCT/JP2021/013463 on Mar. 30, 2021, now Pat. No. 11,885,734.

(30) Foreign Application Priority Data

Mar. 31, 2020 (JP) ................................ 2020-065374

(51) Int. Cl.
*G01N 17/00* (2006.01)
*G02F 1/1335* (2006.01)

(52) U.S. Cl.
CPC ....... *G01N 17/00* (2013.01); *G02F 1/133528* (2013.01); *G02F 2201/50* (2013.01)

(58) Field of Classification Search
CPC .............. G01N 17/00; G02F 1/133528; G02F 2201/50

See application file for complete search history.

(56) References Cited

U.S. PATENT DOCUMENTS

2008/0102226 A1  5/2008 Lee et al.
2019/0004367 A1* 1/2019 Koike ............... G02F 1/133603

FOREIGN PATENT DOCUMENTS

CN    101010623 A    8/2007
JP    H08-057950    3/1996
(Continued)

OTHER PUBLICATIONS

International Search Report of PCT/JP2021/013463, Jun. 1, 2021, 7 pages including English translation.

(Continued)

*Primary Examiner* — Jamil Ahmed
(74) *Attorney, Agent, or Firm* — HSML P.C.

(57) ABSTRACT

The present disclosure addresses the problem of providing an optical plastic film such that rainbow unevenness when viewed with naked eyes and blackout when viewed with polarized sunglasses can be suppressed without any axis alignment or increase in the in-plane phase difference. Disclosed is an optical plastic film satisfying the following conditions 1 and 2: <Condition 1> when a large sample with a size of 200 mm×300 mm is cut out from a plastic film, the large sample is divided into 30 small samples of 40 mm×50 mm, a region of 30 mm×40 mm obtained by excluding 5 mm from each edge of each small sample is subdivided into 47,000 or more regions, and an in-plane phase difference of each subdivided region is then measured, a percentage of small samples in which an average of the in-plane phase difference of each region measured is 50 nm or more and 1,200 nm or less, among the 30 small samples is 50% or more; and <Condition 2> when the 30 small samples are (Continued)

processed in the same manner as in condition 1 and an angle of slow axis of each subdivided region of each small sample is measured, a percentage of small samples in which a standard deviation a calculated from the angle of slow axis of each region measured is 0.8 degrees or more, among the 30 small samples is 50% or more.

6 Claims, 3 Drawing Sheets

(56) References Cited

FOREIGN PATENT DOCUMENTS

| | | |
|---|---|---|
| JP | 2006-241446 | 9/2006 |
| JP | 2009-300611 | 12/2009 |
| JP | 2010-244059 | 10/2010 |
| JP | 2010277028 A | 12/2010 |
| JP | 2011053271 A | 3/2011 |
| JP | 2011-107198 | 6/2011 |
| JP | 2016-132765 | 7/2016 |
| JP | 2016-141058 | 8/2016 |
| JP | 2016-190437 | 11/2016 |
| JP | 2019-090905 | 6/2019 |
| JP | 2019-174636 | 10/2019 |
| WO | 2015-156199 | 10/2015 |
| WO | 2016/080342 | 5/2016 |
| WO | 2016194488 A1 | 12/2016 |
| WO | 2020/241731 | 12/2020 |
| WO | 2020/241732 | 12/2020 |

OTHER PUBLICATIONS

Office Action issued for Chinese Patent Application No. 202310868742.5, dated Sep. 25, 2024, 14 pages including English machine translation.

* cited by examiner

[Fig. 1]
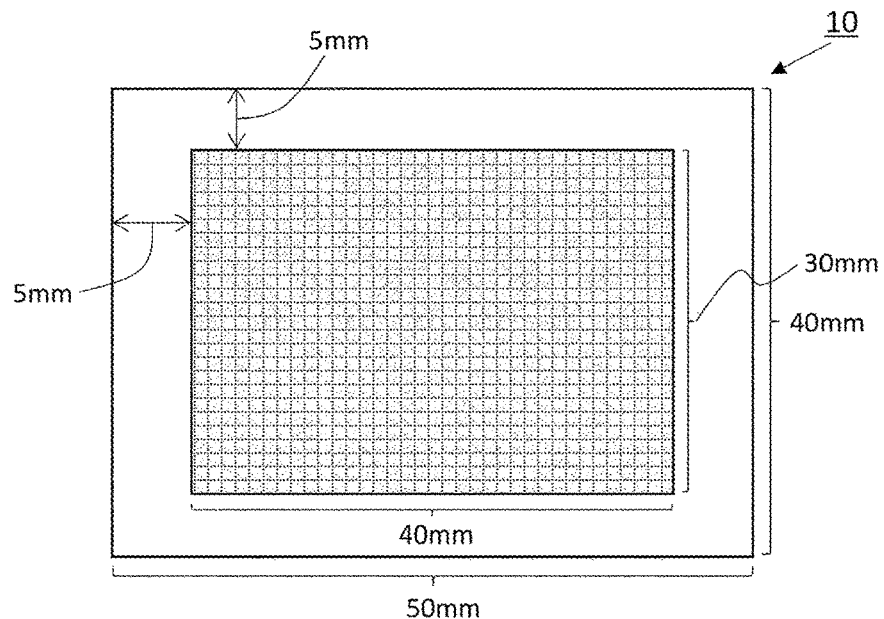
[Fig. 2]
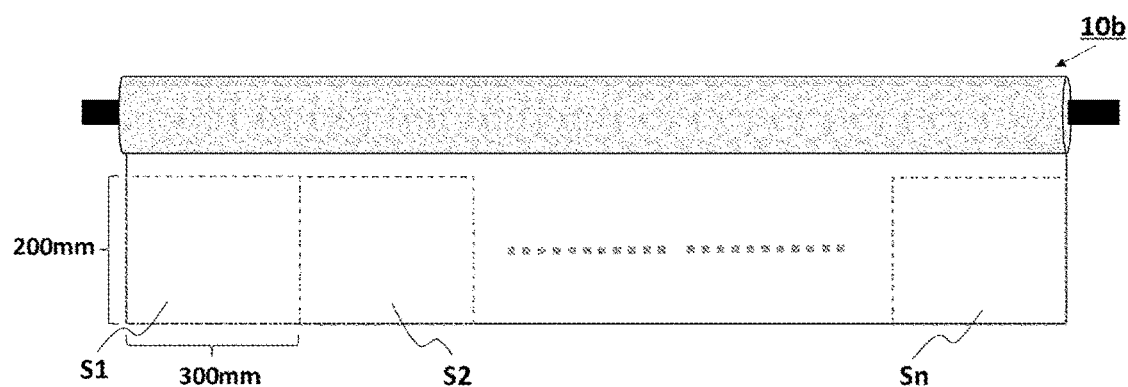
[Fig. 3]
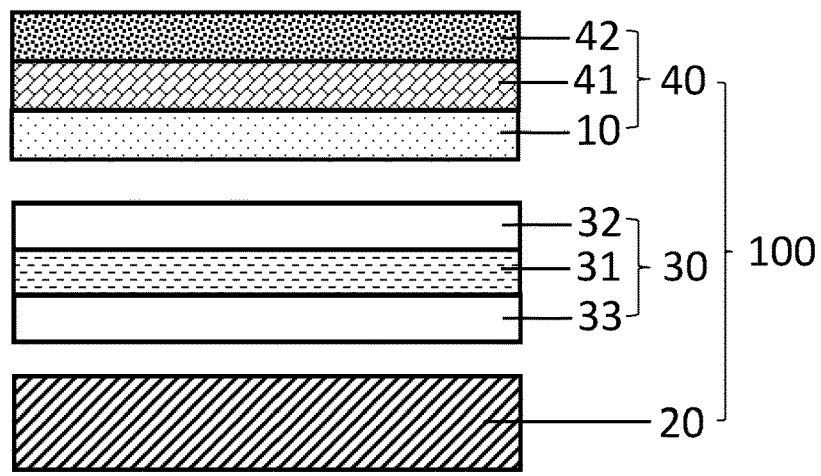

[Fig. 4]
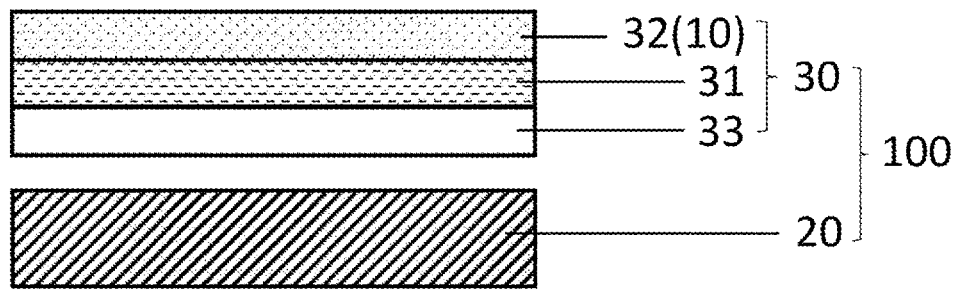
[Fig. 5]
(A)
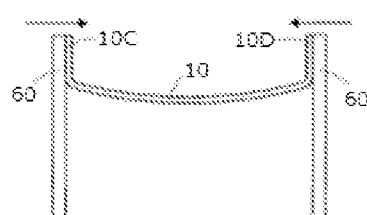
(B)
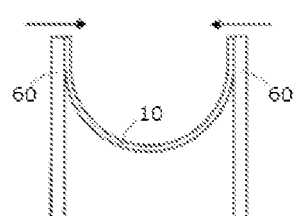
(C)
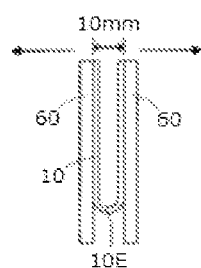

[Fig. 6]
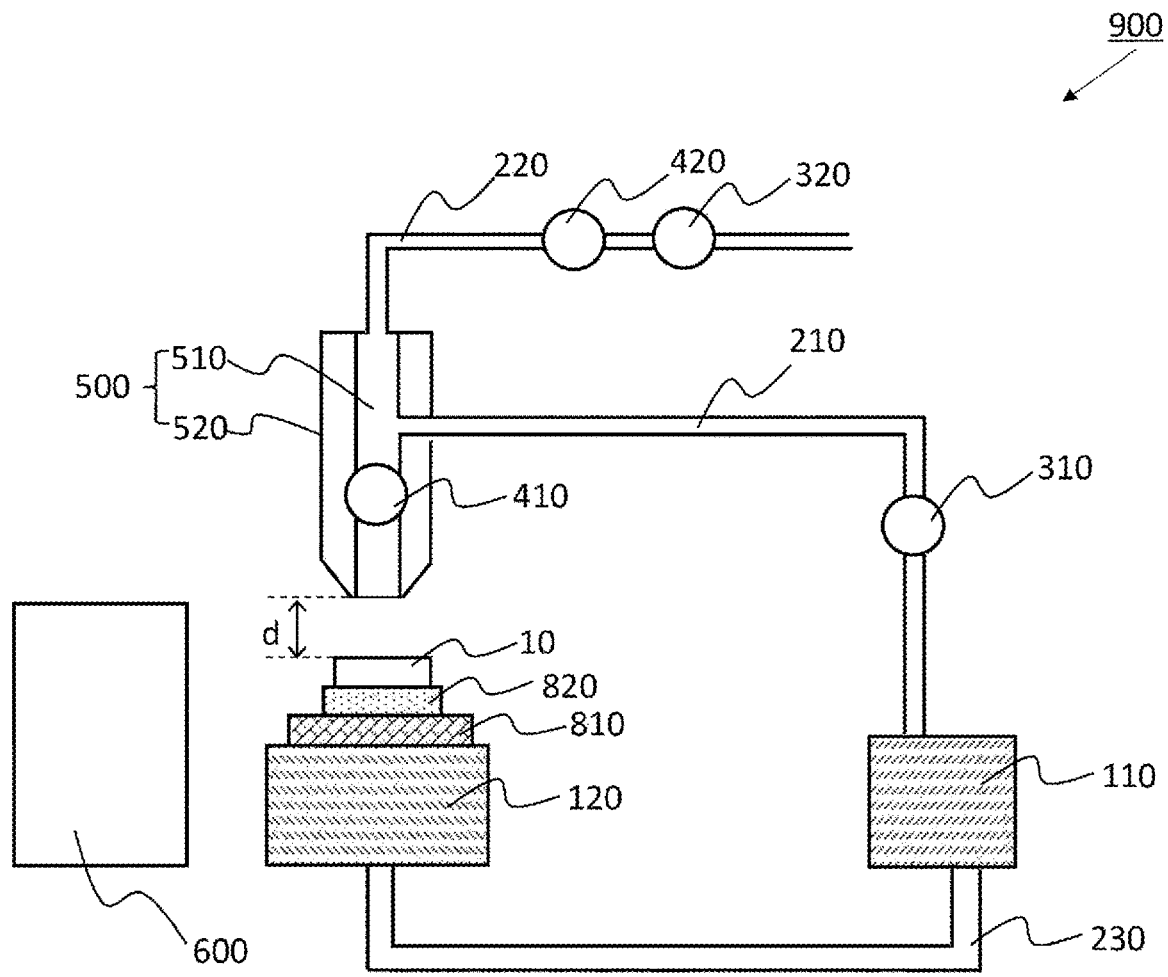
[Fig. 7]
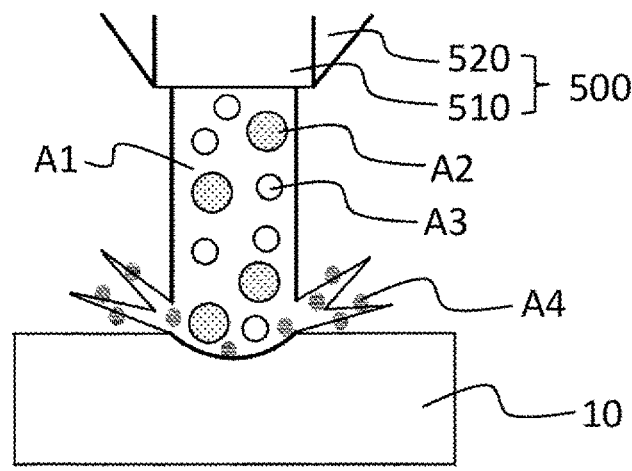

OPTICAL PLASTIC FILM, AND OPTICAL LAMINATE, POLARIZATION PLATE, AND IMAGE DISPLAY DEVICE USING SAME

TECHNICAL FIELD

The present disclosure relates to an optical plastic film, and an optical laminate, a polarization plate, and an image display device using the film.

BACKGROUND ART

In many cases, various optical plastic films are used for optical components of image display devices and others. For example, in an image display device with a polarization plate on a display element, a plastic film is used to protect a polarizer included in the polarization plate. As used herein, the wording "plastic film for protecting a polarizer" is sometimes referred to as a "polarizer protection film".

Plastic films for image display devices, as represented by polarizer protection films, preferably have excellent mechanical strength. For this reason, stretched plastic films are preferably used as the plastic films for image display devices.

When a stretched plastic film is disposed on a polarizer, the stretched plastic film disturbs the polarization state of linearly polarized light passing through the polarizer. This causes rainbow-like unevenness to be observed. In order to solve such a problem, PTLs 1 to 3, for instance, have been proposed. As used herein, the term "rainbow-like unevenness" is sometimes referred to as "rainbow unevenness".

CITATION LIST

Patent Literature

PTL 1: JP 2009-300611 A
PTL 2: JP 2010-244059 A
PTL 3: JP 2011-107198 A

SUMMARY OF INVENTION

Technical Problem

In PTLs 1 and 2, the absorption axis of polarizer and the slow axis of stretched plastic film are arranged so that they are parallel or perpendicular to each other. This can suppress rainbow unevenness.

However, the polarizer and the stretched plastic film may be disposed so as to satisfy the relationship defined in PTLs 1 and 2. This causes the problem of occurrence of phenomenon that the screen turns black when the image display device is viewed with polarized sunglasses. As used herein, the phenomenon is sometimes referred to as "blackout".

PTL 3 discloses a liquid crystal display device in which rainbow unevenness and blackout can be eliminated by setting a light source of the image display device to be a specific white light source, making the in-plane phase difference of the stretched plastic film as high as 3,000 nm or more and 30,000 nm or less, and positioning the absorption axis of the polarizer and the slow axis of the stretched plastic film at an angle of approximately 45 degrees.

Unfortunately, a stretched plastic film with a large in-plane phase difference must be used in PTL 3. In addition, the stretched plastic film with a large in-plane phase difference is usually uniaxially stretched, which causes problems such as a tendency to break in the stretching direction.

Further, in PTL 3, delicate axis alignment is required between the absorption axis of the polarizer and the slow axis of the stretched plastic film in order to suppress the blackout. This causes poor workability, and it has thus been difficult to achieve high yield.

An object of the present disclosure is to provide an optical plastic film, and an optical laminate, a polarization plate, and an image display device using the film such that rainbow unevenness when viewed with naked eyes and blackout when viewed with polarized sunglasses can be suppressed without any axis alignment or increase in the in-plane phase difference.

Solution to Problem

The present inventors have conducted intensive research and as a result, have found a solution to the above problem such that in a plastic film with a low in-plane phase difference, the angle of slow axis of the plastic film is not made uniform, and the standard deviation σ of the angle is intentionally set to a predetermined value or more.

The present disclosure provides an optical plastic film, and an optical laminate, a polarization plate, and an image display device using the film as described below.

[1] An optical plastic film satisfying the following conditions 1 and 2:
<Condition 1>
when a large sample with a size of 200 mm×300 mm is cut out from a plastic film, the large sample is divided into 30 small samples of 40 mm×50 mm, a region of 30 mm×40 mm obtained by excluding 5 mm from each edge of each small sample is subdivided into 47,000 or more regions, and an in-plane phase difference of each subdivided region is then measured, a percentage of small samples in which an average of the in-plane phase difference of each region measured is 50 nm or more and 1,200 nm or less, among the 30 small samples is 50% or more; and
<Condition 2>
when the 30 small samples are processed in the same manner as in condition 1 and an angle of slow axis of each subdivided region of each small sample is measured, a percentage of small samples in which a standard deviation σ calculated from the angle of slow axis of each region measured is 0.8 degrees or more, among the 30 small samples is 50% or more.

[2] An optical laminate comprising a functional layer on the optical plastic film according to [1].

[3] A polarization plate comprising: a polarizer; a first transparent protective plate disposed on one side of the polarizer; and a second transparent protective plate disposed on the other side of the polarizer, wherein at least one selected from the group consisting of the first transparent protective plate and the second transparent protective plate is the optical plastic film according to [1].

[4] An image display device comprising a display element and a plastic film disposed on a light emitting surface side of the display element, wherein the plastic film is the optical plastic film according to [1].

Advantageous Effects of Invention

The optical plastic film, and the optical laminate, polarization plate, and image display device using the film of the present disclosure are provided such that rainbow unevenness when viewed with naked eyes and blackout when viewed with polarized sunglasses can be suppressed without increasing the in-plane phase difference.

BRIEF DESCRIPTION OF DRAWINGS

FIG. 1 is a plan view illustrating a 40 mm×50 mm sample and a region of 30 mm×40 mm obtained by excluding 5 mm from each edge of the sample, in conditions 1 and 2.

FIG. 2 illustrates a procedure for sampling from a roll-like plastic film.

FIG. 3 is a cross-sectional view of an embodiment of an image display device in the present disclosure.

FIG. 4 is a cross-sectional view of another embodiment of the image display device in the present disclosure.

FIG. 5 (A)-(C) are diagrams schematically illustrating how a continuous folding test looks.

FIG. 6 is a schematic cross-sectional view of an instrument for measuring the erosion rate of plastic film.

FIG. 7 is a diagram that depicts the state of abrasion of a plastic film by using a test solution containing pure water and spherical silica as jetted from a jetting section.

DESCRIPTION OF EMBODIMENTS

Hereinbelow, embodiments of the present disclosure will be described.

Optical Plastic Film

An optical plastic film of the present disclosure satisfies the following conditions 1 and 2:
<Condition 1>
  when a large sample with a size of 200 mm×300 mm is cut out from a plastic film, the large sample is divided into 30 small samples of 40 mm×50 mm, a region of 30 mm×40 mm obtained by excluding 5 mm from each edge of each small sample is subdivided into 47,000 or more regions, and an in-plane phase difference of each subdivided region is then measured, a percentage of small samples in which an average of the in-plane phase difference of each region measured is 50 nm or more and 1,200 nm or less, among the 30 small samples is 50% or more; and
<Condition 2>
  when the 30 small samples are processed in the same manner as in condition 1 and an angle of slow axis of each subdivided region of each small sample is measured, a percentage of small samples in which a standard deviation σ calculated from the angle of slow axis of each region measured is 0.8 degrees or more, among the 30 small samples is 50% or more.
<About Measurement>
Each large sample with a size of 200 mm×300 mm used in conditions 1 and 2 is cut out from a plastic film at an arbitrary position.

For conditions 1 and 2, the above-described large sample is divided into 30 small samples of 40 mm×50 mm, and a region of 30 mm×40 mm obtained by excluding 5 mm from each edge of each small sample is measured. In FIG. 1, the outer rectangular region illustrates a small sample with a size of 40 mm×50 mm, and the inner rectangular region illustrates a region of 30 mm×40 mm.

The reason for measuring the region obtained by excluding 5 mm from each edge of the small sample is because when a large sample is cut, stress is likely to be imposed at or near each edge of the plastic film. Thus, the case where the optical axis at or near each edge of the small sample is distorted is taken into account.

Examples of the optical plastic film include the case of a sheet-like shape or the case of a roll-like shape. It is preferable that a large sample is excised from the sheet-shaped plastic film or the roll-shaped plastic film as described below, and 30 small samples are cut out from the large sample to evaluate them under conditions 1 and 2.

If multiple large samples with a size of 200 mm×300 mm can be sampled from a sheet-like plastic film, the sampling preferably conducted in a layout that allows the greatest number of large samples to be obtained.

If multiple large samples with a size of 200 mm×300 mm can be sampled from a sheet-like plastic film, any of the large samples preferably satisfy conditions 1 and 2. In order to better elicit the effect of the present disclosure, the percentage of large samples satisfying conditions 1 and 2 out of all the large samples is preferably 50% or more, more preferably 70% or more, still more preferably 90% or more, and still more preferably 100%. The same applies to condition 3 described later.

In the case of a roll-like plastic film, it is preferable to determine whether or not conditions 1 and 2 are satisfied for each width direction of the roll as shown in (1) to (4) below.
(1) Cut out as many large samples of 200 mm in the flow direction×300 mm in the width direction as possible in the width direction of a roll-like plastic film 10b. For example, if the roll width is 1,200 mm, 4 large samples are cut out. For example, if the roll width is 1,600 mm, 5 large samples are cut out. If the roll width is 1,600 mm, a 100-mm margin occurs in the width direction. The cut-out large samples are called S1, S2, ..., and Sn (see FIG. 2).
(2) Cut out 30 small samples of 40 mm×50 mm from the large sample S1, perform measurements involving conditions 1 and 2, and determine whether or not they satisfy conditions 1 and 2.
(3) The properties of the roll-like plastic film tend to change in the width direction, but are almost the same in the flow direction. Accordingly, if the large sample S1 satisfies conditions 1 and 2, a sample where the roll widthwise position is the same as that of the large sample S1 is regarded such that the every sample in the roll flow direction satisfies conditions 1 and 2.
(4) Apply the same operations like the above (2) and (3) to the large samples S2, ... Sn, and determine whether or not the large samples S2, ... Sn each satisfy conditions 1 and 2. Then, if a large sample from the large samples S2, ... Sn satisfies conditions 1 and 2, a sample where the roll widthwise position is the same as that of the large sample is regarded such that the every sample in the roll flow direction satisfies conditions 1 and 2. The same applies to condition 3 described later.

Conditions 1 and 2 require that a region of 30 mm×40 mm obtained by excluding 5 mm from each edge of each small sample is subdivided into 47,000 or more regions, and the in-plane phase difference and the angle of slow axis are then measured for each subdivided region. If the number of subdivided regions is 47,000 or more, the value of standard deviation σ is sufficiently reliable. Therefore, the number of subdivided regions may be, for example, about 47,000, about 70,000, or even about 100,000. Needless to say, the size of each subdivided region should be roughly equal. Such measurements can be conducted, for example, with a two-dimensional distribution tester for birefringence.

A Photonic Lattice's "WPA-200-L (trade name)" can be exemplified as the two-dimensional distribution tester for birefringence. When the Photonic Lattice's "WPA-200-L (trade name)" is used, a small sample is set on a stage of the tester and a preview field should be adjusted so that the number of pixels displaying a region of 30 mm×40 mm is 47,000 or more. This makes it possible to measure the in-plane phase difference and the angle of slow axis in each of 47,000 or more subdivided regions.

The in-plane phase difference for condition 1 and the phase difference in the thickness direction for condition 3 described below are expressed in the following equations (1) and (2) by using the refractive index nx in the slow-axis direction, which is the direction with the highest refractive index at each measurement point, the refractive index ny in the fast-axis direction, which is the direction orthogonal to the slow-axis direction at each measurement point, the refractive index nz in the thickness direction of the plastic film, and the thickness T [nm] of the plastic film. As used herein, the term "in-plane phase difference" is sometimes referred to as "Re" and the term "phase difference in the thickness direction" is sometimes referred to as "Rth".

$$\text{In-plane phase difference } (Re)=(nx-ny)\times T \text{ [nm]} \quad (1)$$

$$\text{Phase difference in thickness direction } (Rth)=((nx+ny)/2-nz)\times T \text{ [nm]} \quad (2)$$

An optical plastic film of the present disclosure should satisfy the following condition 1:
<Condition 1>
when a large sample with a size of 200 mm×300 mm is cut out from a plastic film, the large sample is divided into 30 small samples of 40 mm×50 mm, a region of 30 mm×40 mm obtained by excluding 5 mm from each edge of each small sample is subdivided into 47,000 or more regions, and an in-plane phase difference of each subdivided region is then measured, a percentage of small samples in which an average of the in-plane phase difference of each region measured is 50 nm or more and 1,200 nm or less, among the 30 small samples is 50% or more.

As used herein, in conditions 1 and 2, the values at a wavelength of 543 nm are meant.

When the average of the in-plane phase difference of plastic film is less than 50 nm, it is difficult to suppress blackout. This is because the plastic film having an average of the in-plane phase difference of less than 50 nm is unlikely to disrupt linearly polarized light. Thus, the linearly polarized light passes therethrough as it is.

On the other hand, when the average of the in-plane phase difference of plastic film exceeds 1,200 nm, rainbow unevenness cannot be suppressed when the film is viewed with naked eyes.

Even if a small sample has an average of the in-plane phase difference of 50 nm or more and 1,200 nm or less but the percentage is less than 50%, blackout cannot be suppressed or rainbow unevenness cannot be suppressed when the film is viewed with naked eyes. Out of 30 small samples, the percentage of small samples showing an average of the in-plane phase difference of 50 nm or more and 1,200 nm less in each measurement region is preferably 70% or more, more preferably 90% or more, and still more preferably 100%.

In the technology where the in-plane phase difference is set to 3,000 nm or more as shown in PTL 3, rainbow unevenness cannot be suppressed when the optical spectral shape of image display device is sharp. On the other hand, when the in-plane phase difference is made smaller as in the present disclosure, the rainbow unevenness can be eliminated even if the optical spectral shape of image display device is sharp.

In condition 1, to suppress blackout more readily, the average of the in-plane phase difference is preferably 100 nm or more, more preferably 150 nm or more, still more preferably 200 nm or more, still more preferably 250 nm or more, still more preferably 300 nm or more, still more preferably 400 nm or more, still more preferably 520 nm or more, and still more preferably 620 nm or more. Note that if the average of the in-plane phase difference of the plastic film is too small, the standard deviation σ of the angle of slow axis may become too large. Therefore, it is desirable to keep the average of the in-plane phase difference at a predetermined value or larger in order to prevent the standard deviation σ of the angle of slow axis from becoming too large.

The small in-plane phase difference of the plastic film means that the molecular orientation of resin constituting the plastic film is insufficient and/or the thickness of the plastic film is thin. Accordingly, the pencil hardness of the plastic film can be improved by setting the average of the in-plane phase difference of the plastic film to be equal to or higher than a predetermined value. To make favorable the pencil hardness of plastic film, the average of the in-plane phase difference of the plastic film is preferably 100 nm or more, more preferably 520 nm or more, and still more preferably 620 nm or more.

In condition 1, the average of the in-plane phase difference is preferably 1,100 nm or less, more preferably 1,000 nm or less, and still more preferably 950 nm or less, in order to more readily suppress rainbow unevenness when viewed with naked eyes. In addition, when the average of the in-plane phase difference is large, the bending resistance tends to decrease, which will be discussed later. By setting the average of the in-plane phase difference to 950 nm or less, a decrease in the bending resistance can be easily suppressed.

In the requirements shown herein, multiple options for the upper and lower limits of each numerical value may be indicated. In this case, one of the upper limit options and one of the upper limit options may be combined to provide an embodiment of the numerical range.

In the case of the above average of the in-plane phase difference, examples of the embodiment of the numerical range include 50 nm or more and 1,200 nm or less, 50 nm or more and 1,100 nm or less, 50 nm or more and 1,000 nm or less, 50 nm or more and 950 nm or less, 100 nm or more and 1,200 nm or less, 100 nm or more and 1100 nm or less, 100 nm or more and 1,000 nm or less, 100 nm or more and 950 nm or less, 150 nm or more and 1,200 nm or less, 150 nm or more and 1,100 nm or less, 150 nm or more and 1,000 nm or less, 150 nm or more and 950 nm or less, 200 nm or more and 1,200 nm or less, 200 nm or more and 1,100 nm or less, 200 nm or more and 1,000 nm or less, 200 nm or more and 950 nm or less, 250 nm or more and 1,200 nm or less, 250 nm or more and 1,100 nm or less, 250 nm or more and 1,000 nm or less, 250 nm or more and 950 nm or less, 300 nm or more and 1,200 nm or less, 300 nm or more and 1,100 nm or less, 300 nm or more and 1,000 nm or less, 300 nm or more and 950 nm or less, 400 nm or more and 1,200 nm or less, 400 nm or more and 1,100 nm or less, 400 nm or more and 1,000 nm or less, 400 nm or more and 950 nm or less, 520 nm or more and 1,200 nm or less, 520 nm or more and 1,100 nm or less, 520 nm or more and 1,000 nm or less, 520 nm or more and 950 nm or less, 620 nm or more and 1,200 nm or less, 620 nm or more and 1,100 nm or less, 620 nm or more and 1,000 nm or less, or 620 nm or more and 950 nm or less.

The standard deviation σ of the in-plane phase difference of each subdivided region is not particularly limited, but the lower limit is preferably 5 nm or more, more preferably 10 nm or more, still more preferably 15 nm or more, and still more preferably 20 nm or more and the upper limit is preferably 100 nm or less, more preferably 70 nm or less, and still more preferably 50 nm or less.

Examples of the embodiment of the range of standard deviation σ of the in-plane phase difference include 5 nm or more and 100 nm or less, 5 nm or more and 70 nm or less, 5 nm or more and 50 nm or less, 10 nm or more and 100 nm or less, 10 nm or more and 70 nm or less, 10 nm or more and 50 nm or less, 15 nm or more and 100 nm or less, 15 nm or more and 70 nm or less, 15 nm or more and 50 nm or less, 20 nm or more and 100 nm or less, 20 nm or more and 70 nm or less, or 20 nm or more and 50 nm or less.

An optical plastic film of the present disclosure should satisfy the following condition 2:

<Condition 2>
 when the 30 small samples are processed in the same manner as in condition 1 and an angle of slow axis of each subdivided region of each small sample is measured, a percentage of small samples in which a standard deviation σ calculated from the angle of slow axis of each region measured is 0.8 degrees or more, among the 30 small samples is 50% or more.

That the standard deviation σ of the angle of slow axis is 0.8 degrees or more indicates that there is a deviation in the slow axis of the plastic film. When the standard deviation σ is less than 0.8 degrees, the blackout cannot be suppressed.

In addition, there may be any small sample where the standard deviation σ of the angle of slow axis shows 0.8 degrees or more. Even in this case, if the percentage of such small samples is less than 50%, information on the display cannot be read due to partial blackout. Out of 30 small samples, the percentage of small samples showing a standard deviation σ of 0.8 degrees or more as calculated from the angle of slow axis in each measurement region is preferably 70% or more, more preferably 90% or more, and still more preferably 100%.

Conventional optical plastic films are designed such that the direction of the slow axis is not deviated. However, the optical plastic film of the present disclosure differs from the conventional optical films in the configuration that the direction of slow axis is deliberately deviated. Further, the optical plastic film of the present disclosure is also characterized by its focus on the variation of the slow axis in the relatively narrow region of 30 mm×40 mm.

Besides, satisfying condition 2 is also desirable because the plastic film has favorable bending resistance.

Meanwhile, general-purpose oriented films with an aligned slow axis tend to break after a bending test, or have a strong bending habit. Specifically, a uniaxially stretched film such as in PTL 3 breaks when subjected to a bending test along the slow axis, and have a strong bending habit when subjected to a bending test in a direction perpendicular to the slow axis. In addition, general-purpose biaxially stretched films have a strong bending habit when subjected to a bending test in a direction perpendicular to the slow axis.

The plastic film of the present disclosure is preferable in view of preventing a bending habit from remaining and preventing a break after the bending test regardless of the bending direction.

In condition 2, the standard deviation σ is preferably 0.9 degrees or more, more preferably 1.0 degrees or more, still more preferably 1.2 degrees or more, and still more preferably 1.6 degrees or more. By setting the standard deviation σ to 1.6 degrees or more, the effect of suppressing blackout may be remarkable.

If the standard deviation σ in condition 2 is too large, the orientation of the plastic film tends to be low, the mechanical strength and pencil hardness tend to decrease, and environmental changes tend to cause wrinkles, resulting in an adverse effect on visibility. Therefore, in condition 2, the standard deviation σ is preferably 20.0 degrees or less, more preferably 15.0 degrees or less, still more preferably 10.0 degrees or less, still more preferably 7.0 degrees or less, and still more preferably 5.0 degrees or less.

Examples of the embodiment of the range of the standard deviation σ in condition 2 include 0.8 degrees or more, 0.8 degrees or more and 20.0 degrees or less, 0.8 degrees or more and 15.0 degrees or less, 0.8 degrees or more and 10.0 degrees or less, 0.8 degrees or more and 7.0 degrees or less, 0.8 degrees or more and 5.0 degrees or less, 0.9 degrees or more and 20.0 degrees or less, 0.9 degrees or more and 15.0 degrees or less, 0.9 degrees or more and 10.0 degrees or less, 0.9 degrees or more and 7.0 degrees or less, 0.9 degrees or more and 5.0 degrees or less, 1.0 degree or more and 20.0 degrees or less, 1.0 degree or more and 15.0 degrees or less, 1.0 degree or more and 10.0 degrees or less, 1.0 degree or more and 7.0 degrees or less, 1.0 degree or more and 5.0 degrees or less, 1.2 degrees or more and 20.0 degrees or less, 1.2 degrees or more and 15.0 degrees or less, 1.2 degrees or more and 10.0 degrees or less, 1.2 degrees or more and 7.0 degrees or less, 1.2 degrees or more and 5.0 degrees or less, 1.6 degrees or more and 20.0 degrees or less, 1.6 degrees or more and 15.0 degrees or less, 1.6 degrees or more and 10.0 degrees or less, 1.6 degrees or more and 7.0 degrees or less, or 1.6 degrees or more and 5.0 degrees or less.

Preferably, an optical plastic film of the present disclosure satisfy the following condition 2':

<Condition 2'>
 when the 30 small samples are processed in the same manner as in condition 1 and an angle of slow axis of each subdivided region of each small sample is measured, a percentage of small samples in which a standard deviation 3σ calculated from the angle of slow axis of each region measured is 30.0 degrees or less, among the 30 small samples is 50% or more.

If the standard deviation 3σ of condition 2' is too large, the orientation of the plastic film may become too low, and the pencil hardness tends to decrease. Thus, it can be made easier to obtain a favorable pencil hardness of plastic film by setting the standard deviation 3σ to 30.0 degrees or less. The standard deviation 3σ is more preferably 25.0 degrees or less, still more preferably 20.0 degrees or less, still more preferably 15.0 degrees or less, and still more preferably 10.0 degrees or less.

If the standard deviation 3σ of condition 2' is too small, the plastic film may become brittle due to too high orientation of the plastic film. Thus, the standard deviation 3σ is preferably 2.4 degrees or more, more preferably 2.7 degrees or more, still more preferably 3.0 degrees or more, still more preferably 3.6 degrees or more, and still more preferably 4.8 degrees or more.

Examples of the embodiment of the range of the standard deviation 3σ in condition 2' include 2.4 degrees or more and 30.0 degrees or less, 2.4 degrees or more and 25.0 degrees or less, 2.4 degrees or more and 20.0 degrees or less, 2.4 degrees or more and 15.0 degrees or less, 2.4 or more and 10.0 degrees or less, 2.7 degrees or more and 30.0 degrees or less, 2.7 degrees or more and 25.0 degrees or less, 2.7 degrees or more and 20.0 degrees or less, 2.7 degrees or more and 15.0 degrees or less, 2.7 degrees or more and 10.0 degrees or less, 3.0 degrees or more and 30.0 degrees or less, 3.0 degrees or more and 25.0 degrees or less, 3.0 degrees or more and 20.0 degrees or less, 3.0 degrees or more and 15.0 degrees or less, 3.0 degrees or more and 10.0 degrees or less, 3.6 degrees or more and 30.0 degrees or less, 3.6 degrees or more and 25.0 degrees or less, 3.6 degrees or more and 20.0 degrees or less, 3.6 degrees or more and 15.0 degrees or less, 3.6 degrees or more and 10.0 degrees or less, 4.8 degrees or more and 30.0 degrees or less, 4.8 degrees or more and 25.0 degrees or less, 4.8 degrees or more and 20.0 degrees or less, 4.8 degrees or more and 15.0 degrees or less, or 4.8 degrees or more and 10.0 degrees or less.

As used herein, the atmosphere for the measurements of conditions 1 and 2 as well as condition 2' and conditions 3 to 6 and other measurements such as total light transmittance should be at a temperature of 23° C.±5° C. and a relative humidity of 40% or more and 65% or less, unless otherwise specified. In addition, unless otherwise noted, samples should be exposed to the above atmosphere for 30 minutes or more before each measurement.

Preferably, an optical plastic film of the present disclosure satisfy the following condition 3:

<Condition 3> when a phase difference in a thickness direction is measured at a center of each region of 30 mm×40 mm for each of the 30 small samples, a percentage of small samples in which the phase difference in the thickness direction is 2,000 nm or more, among the 30 small samples is 50% or more.

As used herein, in condition 3, the values at a wavelength of 589.3 nm are meant.

When condition 3 is met, this can make it easier to suppress blackout not only in the frontal direction but also when viewed from an oblique direction. Out of 30 small samples, the percentage of small samples showing a phase difference in the thickness direction of 2,000 nm or more is preferably 70% or more, more preferably 90% or more, and still more preferably 100%.

In condition 3, the phase difference in the thickness direction is more preferably 3,000 nm or more, still more preferably 4,000 nm or more, and still more preferably 5,000 nm or more.

The upper limit of the phase difference in the thickness direction in condition 3 is not limited. In order to make it easier to satisfy condition 4 described below, the upper limit is preferably 15,000 nm or less, more preferably 12,000 nm or less, and still more preferably 9,000 nm or less.

Examples of the embodiment of the range of phase difference in the thickness direction in condition 3 include 2,000 nm or more, 2,000 nm or more and 15,000 nm or less, 2,000 nm or more and 12,000 nm or less, 2,000 nm or more and 9,000 nm or less, 3,000 nm or more and 15,000 nm or less, 3,000 nm or more and 12,000 nm or less, 3,000 nm or more and 9,000 nm or less, 4,000 nm or more and 15,000 nm or less, 4,000 nm or more and 12,000 nm or less, 4,000 nm or more and 9,000 nm or less, 5,000 nm or more and 15,000 nm or less, 5,000 nm or more and 12,000 nm or less, or 5,000 nm or more and 9,000 nm or less.

The phase difference in the thickness direction in condition 3 may be measured, for example, with the trade name "RETS-100", manufactured by OTSUKA ELECTRONICS CO., LTD.

In the case of measuring, for instance, the phase difference in the thickness direction by using the trade name "RETS-100" manufactured by OTSUKA ELECTRONICS CO., LTD, it is preferable to prepare for the measurement according to the following procedures (A1) to (A4).

(A1) First, to stabilize the light source of RETS-100, leave it on for 60 minutes or more after turning on the light source. Then, select an optical rotational analyzer method and select θ mode. The θ mode is a mode for angular phase difference measurement and Rth calculation. By selecting this θ mode, the stage becomes an inclined rotation stage.

(A2) Then, input the following measurement conditions to the RETS-100.

(Measurement Conditions)

Retardation measurement range: Optical rotational analyzer method

Measurement spot diameter: ϕ5 mm

Inclination angle range: 0°

Measurement wavelength range: 400 nm or more and 800 nm or less

Plastic film average refractive index: For example, in the case of PET film, N=1.617.

Thickness: Thickness separately measured by SEM (A3) Then, obtain background data without placing the sample in this instrument. The instrument should be a closed system. Perform (A1) to (A3) every time the light source is turned on.

(A4) Thereafter, place the sample on a stage in the instrument for measurement.

Preferably, an optical plastic film of the present disclosure satisfy the following condition 4:

<Condition 4> a percentage of small samples in which the average of the in-plane phase difference with respect to the phase difference in the thickness direction is 0.20 or less, among the 30 small samples is 50% or more.

The average of the in-plane phase difference with respect to the phase difference in the thickness direction is "the average of the in-plane phase difference/the phase difference in the thickness direction". The smaller the average of the in-plane phase difference/the phase difference in the thickness direction, the closer the degree of stretching of the optical plastic film becomes even biaxiality. Thus, by setting the rate to 0.20 or less, it may be made easier to improve the mechanical strength and pencil hardness of the plastic film. In addition, it is possible to suppress the adverse effects on visibility as caused by wrinkles in the plastic film due to environmental changes. Out of 30 small samples, the percentage of small samples showing the rate of 0.20 or less is preferably 70% or more, more preferably 90% or more, and still more preferably 100%.

The rate of condition 4 is more preferably 0.17 or less and still more preferably 0.15 or less.

The lower limit of the rate in condition 4 is not particularly limited. The lower limit of the rate in condition 4 is usually around 0.01.

Embodiments of the range of rate in condition 4 include 0.20 or less, 0.01 or more and 0.20 or less, 0.01 or more and 0.17 or less, or 0.01 or more and 0.15 or less.

In order to make it easier to obtain the above-mentioned effects by satisfying condition 4, the average of the in-plane phase difference of condition 1 is preferably 100 nm or more.

<Condition 5>

Each of the 30 small samples is used to measure the erosion rate from a surface of the plastic film constituting the small sample to a depth of 20 μm at the center of the region of 30 mm×40 mm described above. When the erosion rate from a surface of the plastic film constituting the small sample to a depth of 20 μm is averaged and defined as $E_{0-20}$, the percentage of small samples in which the $E_{0-20}$ is 1.4 μm/g or more, among the 30 small samples is 50% or more.

As used herein, $E_{0-20}$ is measured under the following measurement conditions.

<Measurement Conditions>

A test solution is prepared by mixing pure water, dispersion, and spherical silica with an average particle size within ±8% of 4.2 μm as a reference at a mass ratio of 968:2:30, and is then put into a container. The test solution in the container is fed to a nozzle. Compressed air is fed into the nozzle to accelerate the test solution within the nozzle, and a predetermined amount of the test solution is jetted perpendicularly onto the plastic film through a jet hole at the tip of the nozzle. This causes the spherical silica in the test solution to collide with the plastic film. The cross-sectional shape of the nozzle is 1 mm×1 mm square, and the distance between the jet hole and the plastic film is 4 mm. Meanwhile, the flow rate of the test liquid or the compressed air supplied to the nozzle, the pressure of the compressed air, and the pressure of the test liquid in the nozzle should be predetermined values adjusted by the calibration described below.

After a predetermined amount of the test solution is jetted, the jetting of the test solution is temporarily stopped.

After the jetting of the test solution is temporarily stopped, the cross-sectional profile of the plastic film where the spherical silica particles in the test solution have collided is measured.

One cycle consists of three steps including: a step of jetting a predetermined amount of the test solution from the jet hole; a step of temporarily stopping the jetting of the test solution after the predetermined amount of the test solution is jetted; and a step of measuring the cross-sectional profile after the jetting of the test solution is temporarily stopped. The cycle is repeated until the depth of the cross-sectional profile exceeds 20 μm. Then, the erosion rate (μm/g) of the plastic film is calculated by dividing the depth of the cross-sectional profile having increased in each cycle (μm) by the amount (g) of the test solution jetted in each cycle, for each cycle until the depth of the cross-sectional profile reaches 20 μm. The erosion rate of the plastic film for each cycle until the depth of the cross-sectional profile reaches 20 μm is averaged to calculate the above $E_{0-20}$.

<Calibration>

The test solution is put into the container. The test solution in the container is fed to the nozzle. Compressed air is fed into the nozzle to accelerate the test solution within the nozzle, and an arbitrary amount of the test solution is jetted perpendicularly onto an acrylic plate with a thickness of 2 mm through a jet hole at the tip of the nozzle. This causes the spherical silica in the test solution to collide with the acrylic plate. The cross-sectional shape of the nozzle is 1 mm×1 mm square, and the distance between the jet hole and the acrylic plate is 4 mm.

After an arbitrary amount of the test solution is jetted, the jetting of the test solution is temporarily stopped. After the jetting of the test solution is temporarily stopped, the cross-sectional profile of the acrylic plate where the spherical silica particles in the test solution have collided is measured.

The erosion rate (μm/g) of the acrylic plate is calculated by dividing the depth (μm) of the cross-sectional profile by the arbitrary amount (g).

If the erosion rate of the acrylic plate is within ±5% of 1.88 (μm/g) as a reference, the test is passed. Meanwhile, the flow rate of the test liquid or the compressed air, the pressure of the compressed air, and the pressure of the test liquid in the nozzle should be adjusted and calibrated so that the erosion rate of the acrylic plate is within the range.

Hereinafter, the measurement conditions of the erosion rate and the technical significance of the erosion rate calculated using the measurement conditions are explained with reference to FIG. 6. For example, an instrument for measuring the erosion rate as shown in FIG. 6 is an MSE testing instrument, product number "MSE-A203", of Palmeso Co., Ltd.

The erosion rate of the present disclosure is measured under the following conditions. First, a test solution is prepared by mixing pure water, a dispersant, and spherical silica with an average particle size within ±8% of 4.2 μm as a reference at a mass ratio of 968:2:30, and is then put into a container (110). In the container (110), the test solution preferably be stirred.

For pure water, general-purpose pure water may be used. The pure water generally has a specific resistance value of 0.1 MΩ·cm or more and 15 MΩ·cm or less.

The dispersant is not particularly limited as long as the spherical silica can be dispersed. Examples of the dispersant include the trade name "DEMOL N" from Wako Pure Chemical Industries, Ltd.

In other words, "average particle size within ±8% of 4.2 μm as a reference" means that the average particle size is 3.864 μm or more and 4.536 μm or less.

Meanwhile, in the measurement conditions of erosion rate herein, the "average particle size of spherical silica" is measured as the volume-averaged value d50 in the particle size distribution measurement by laser light diffractometry, and means the so-called "median diameter".

In the results of measuring the particle size distribution of the spherical silica, the maximum frequency of the particle size is normalized to 100. Preferably, at that time, the range of particle size with a frequency of 50 is within ±10% of 4.2 μm as a reference. The phrase "range of particle size with a frequency of 50" is expressed as "X–Y (μm)" while "X" is defined as the particle size that has a frequency of 50 and is positioned in a more plus direction than the particle size with a frequency of 100 and "Y" is defined as the particle size that has a frequency of 50 and is positioned in a more minus direction than the particle size with a frequency of 100. Note that as used herein, the "range of particle size with a frequency of 50" is sometimes referred to as the "full width at half height of the particle size distribution".

Examples of the spherical silica with an average particle size within ±8% of 4.2 μm as a reference is model number "MSE-BS-5-3" designated by Palmeso Co., Ltd. Examples of the spherical silica corresponding the model number "MSE-BS-5-3" designated by Palmeso Co., Ltd. include the product number "BS5-3" of Potters-Ballotini Co., Ltd.

The test solution in the container is fed into a nozzle (510). The test solution may, for example, be sent to the nozzle through piping (210) for the test solution. Between the container (110) and the nozzle (510), a flow meter (310) for measuring the flow rate of the test solution is preferably disposed. The flow rate of the test solution should be a value adjusted by the above-mentioned calibration.

Note that in FIG. 6, the nozzle (510) is located inside a housing (520) that constitutes a jetting section (500).

Compressed air is fed into the nozzle (510). The compressed air is delivered to the nozzle, for example, through a compressed air line (220). The position in the nozzle where the compressed air is fed preferably be upstream of the position where the test solution is fed. The upstream side is the side far from the nozzle's jet hole.

A flow meter (320) for measuring the flow rate of the compressed air and a pressure gauge (420) for measuring the pressure of the compressed air are preferably installed, before the compressed air arrives at the nozzle (510). The compressed air may be supplied using, for instance, an air compressor (not shown).

The flow rate and the pressure of the compressed air should each be a value adjusted by the above-mentioned calibration.

When compressed air is delivered into the nozzle (510), the test solution is accelerated while being mixed by the compressed air. The accelerated test solution is then jetted through the jet hole at the tip of the nozzle (510) and impacts perpendicularly against a plastic film (10). The plastic film is mainly abraded by spherical silica particles in the test solution.

Note that the inside of the nozzle (510) is preferably provided with a pressure gauge (410) for measuring the pressure of the test solution in the nozzle. The pressure gauge (410) is preferably provided downstream of the position where the compressed air is fed and the position where the test solution is fed.

The pressure of the test solution in the nozzle (510) should be a value adjusted by the above-mentioned calibration.

The test solution jetted through the jet hole at the tip of the nozzle (510) is mixed with air and then sprayed. This can lower the impact pressure of spherical silica particles on the plastic film. Thus, the amount of abrasion of the plastic film by one spherical silica particle can be reduced to a small amount. FIG. 7 is a diagram that depicts the state of abrasion of the plastic film (10) by using a test solution containing pure water (A1) and spherical silica (A2) as jetted from the jetting section (500). In FIG. 7, reference sign A3 denotes air and reference sign A4 denotes a abraded plastic film.

In addition, the test solution contains water, which has an excellent cooling effect. This can practically eliminate deformation and degeneration of the plastic film as caused by heat at the time of impact. In other words, abnormal abrasion of the plastic film can be substantially eliminated. In addition, the water also plays a role in cleaning the abraded plastic film surface and achieving stable abrasion. Further, the water also plays a role in accelerating the spherical silica particles and controlling how the test solution flows.

Furthermore, since a huge number of spherical silica particles collide with the plastic film, the influence of subtle differences in physical properties of individual spherical silica particles can be eliminated.

Moreover, for the measurement conditions in the present disclosure, the flow rate of the test liquid supplied to the nozzle, the flow rate of the compressed air supplied to the nozzle, the pressure of the compressed air supplied to the nozzle, and the pressure of the test liquid in the nozzle are set to values adjusted by the calibration, the cross-sectional shape of the nozzle is set to a square of 1 mm×1 mm, and the distance between the jet hole and the plastic film is set to 4 mm to identify elements having an influence on the amount of abrasion of the plastic film. Note that the distance is denoted by "d" in FIG. 6, and means the vertical distance between the nozzle tip, namely the jet hole, and the plastic film.

From the above, it can be said that the measurement conditions of the present disclosure are those that enable the formation of statistically stable abrasion marks on the plastic film.

The plastic film (10) may be attached to a sample mount (810) of a measurement instrument (900). It is preferable to prepare a laminate prepared by layering a plastic film onto a support (820) such as a stainless steel plate, and attach the laminate to the sample mount (810).

The test solution jetted onto the plastic film (10) preferably be collected in a receptor (120) and returned to the container (110) through return piping (230).

The measurement conditions of the present disclosure require that the jetting of the test solution is temporarily stopped after the jetting of a predetermined amount of the test solution, and that the cross-sectional profile of the plastic film where the spherical silica particles in the test solution collide is measured after the jetting of the test solution is temporarily stopped.

The cross-sectional profile means the cross-sectional shape of the plastic film abraded by the test solution. The plastic film is mainly abraded by spherical silica particles in the test solution.

The cross-sectional profile may be measured by the cross-sectional profile acquisition unit (600) such as a stylus-type surface profilometer or a laser interferometry-type surface profilometer. Note that the cross-sectional profile acquisition unit (600) is usually located at a position away from the plastic film (10) when the test solution is jetted. For this reason, it is preferable that at least one of the plastic film (10) or the cross-sectional profile acquisition unit (600) is movable.

Palmeso Co., Ltd.'s MSE tester, product number "MSE-A203", uses a stylus method for measuring a cross-sectional profile.

Further, under the measurement conditions of the present disclosure, one cycle consists of three steps: a step of jetting a predetermined amount of test solution from the jet hole; a step of temporarily stopping the jetting of the test solution after the predetermined amount of the test solution is jetted; and a step of measuring a cross-sectional profile after the jetting of the test solution is temporarily stopped. The cycle is repeated until the depth of the cross-sectional profile exceeds 20 μm.

This operation is executed to measure the erosion rate of the plastic film at each cycle, and further calculate how much the erosion rate of the plastic varies.

The above cycle may be continued after the depth of the cross-sectional profile exceeds 20 μm, but it is preferable to terminate the cycle when the depth of the cross-sectional profile exceeds 20 μm. Meanwhile, the reason why the measurement is limited to the "depth of 20 μm from the surface of the plastic film" is that the physical properties of the plastic film tend to fluctuate at or near the surface, while they tend to be more stable as the site gets into a deeper portion.

As used herein, the erosion rate at each cycle can be expressed by the following [Equation 1]:

Erosion rate at each cycle (μm/g) =Depth (μm) of cross-sectional profile having increased at each cycle/Amount (g) of test solution jetted in each cycle [Equation 1].

In Equation 1, the "Depth (μm) of cross-sectional profile having increased at each cycle" means a value expressed as "y−x" while the depth of the cross-sectional profile in the nth cycle is defined as x (μm) and the depth of the cross-sectional profile in the (n+1)th cycle as y (μm). Here, for the first cycle, the depth (μm) of the cross-sectional profile at the first cycle corresponds to the "depth of the cross-sectional profile (μm) having increased at each cycle".

Note that as used herein, the depth of the cross-sectional profile at the nth cycle means the depth of the deepest position of the cross-sectional profile at the nth cycle. Here, n is an integer of 1 or more.

In Equation 1, the "amount (g) of the test solution jetted in each cycle" is, in principle, a fixed quantity, but it may vary slightly from cycle to cycle.

The amount of the test solution jetted in each cycle is not particularly limited, but the lower limit is preferably 0.5 g or more and more preferably 1.0 g or more, and the upper limit is preferably 3.0 g or less and more preferably 2.0 g or less.

Under the measurement conditions of the present disclosure, the erosion rate (μm/g) is calculated for each cycle until the depth of the cross-sectional profile reaches 20 μm. The erosion rate at each cycle until the depth of the cross-sectional profile reaches 20 μm is then averaged to calculate $E_{0-20}$.

This cycle is repeated until the depth of the cross-sectional profile exceeds 20 μm. Here, the data obtained at the cycle with a cross-sectional profile depth of more than 20 μm is excluded from the date for calculating $E_{0-20}$.

In general, the softer the plastic film is, the easier it is to scratch, and the harder the film is, the harder it is to scratch. The present inventors considered using, as an index of pencil hardness, the values obtained from evaluations using a picodentor in the depth direction, including, for instance, Martens hardness, indentation hardness, and elastic recovery work. Unfortunately, the above-described parameters such as Martens hardness, indentation hardness, and elastic recovery work were unable to be used as an index of pencil hardness.

In addition, the plastic film when stretched tends to have increased strength. Specifically, uniaxially stretched plastic films tend to have better pencil hardness than unstretched plastic films; and biaxially stretched plastic films tend to have better pencil hardness than the uniaxially stretched plastic films. However, there were cases where pencil hardness was insufficient even for the biaxially stretched plastic films.

The present inventors then examined the erosion rate as an index of pencil hardness of the plastic film. As mentioned above, plastic films are more easily scratched if they are soft and less easily scratched if they are hard. Therefore, it is considered that a smaller erosion rate can correspond to better pencil hardness. However, the present inventors have, instead, found that by increasing the erosion rate $E_{0-20}$ to 1.4 μm/g or more, the plastic film can have favorable pencil hardness. The present inventors have also found that the erosion rate of the plastic film is larger for biaxially stretched plastic films than for uniaxially stretched plastic films, and that the erosion rate can be used to determine whether the pencil hardness of biaxially stretched plastic film is favorable or not.

Incidentally, the pencil hardness of the plastic film is also related to the molecular orientation of resin that constitutes the plastic film, as described above. In addition, the plastic film tends to have better mechanical strength such as pencil hardness if σ and 3σ are not too large.

The reason why the erosion rate of the plastic film correlates with pencil hardness may be as follows.

As described above, under the measurement conditions of the present disclosure, the test solution containing water and spherical silica is mixed with air and sprayed. This can lower the impact pressure of spherical silica particles on the plastic film. Accordingly, in the case of a soft plastic film, the stresses caused by the spherical silica colliding with the plastic film are easily dispersed. This seems to cause the plastic film to be less prone to abrasion, resulting in a low erosion rate. By contrast, in the case of a hard plastic film, the stresses caused by the spherical silica colliding with the plastic film are not easily dispersed. This seems to cause the plastic film to be more prone to abrasion, resulting in a high erosion rate.

Biaxially stretched plastic films have different erosion rates. This seems to be caused by the difference in the degree of elongation of molecular chains and the difference in the degree of molecular orientation. For example, in biaxially stretched plastic films, the molecules are, in principle, stretched in-plane. However, there may be some molecules that are not sufficiently stretched locally in the plane. Thus, it is expected that the biaxially stretched plastic film becomes locally softer and the erosion rate decreases as the percentage of molecules that are not sufficiently stretched locally in the plane increases. In addition, even biaxially stretched plastic films with comparable in-plane phase differences are considered to exhibit different erosion rates due to differences in local molecular orientation.

Out of 30 small samples, the percentage of small samples with $E_{0-20}$ of 1.4 μm/g or more is preferably 70% or more, more preferably 90% or more, and still more preferably 100%.

In condition 5, $E_{0-20}$ of the plastic film is preferably 1.6 μm/g or more, more preferably 1.8 μm/g or more, still more preferably 1.9 μm/g or more, and still more preferably 2.0 μm/g or more in order to obtain better pencil hardness.

The $E_{0-20}$ is preferably 3.0 μm/g or less, more preferably 2.5 μm/g or less, and still more preferably 2.2 μm/g or less in order to make the plastic film less susceptible to cracking.

Examples of the embodiment of a preferable numerical range of $E_{0-20}$ include 1.4 μm/g or more and 3.0 μm/g or less, 1.4 μm/g or more and 2.5 μm/g or less, 1.4 μm/g or more and 2.2 μm/g or less, 1.6 μm/g or more and 3.0 μm/g or less, 1.6 μm/g or more and 2.5 μm/g or less, 1.6 μm/g or more and 2.2 μm/g or less, 1.8 μm/g or more and 3.0 μm/g or less, 1.8 μm/g or more and 2.5 μm/g or less, 1.8 μm/g or more and 2.2 μm/g or less, 1.9 μm/g or more and 3.0 μm/g or less, 1.9 μm/g or more and 2.5 μm/g or less, 1.9 μm/g or more and 2.2 μm/g or less, 2.0 μm/g or more and 3.0 μm/g or less, 2.0 μm/g or more and 2.5 μm/g or less, or 2.0 μm/g or more and 2.2 μm/g or less.

Before the erosion rate described above is measured, the above-described calibration should be performed.

For example, the calibration can be conducted as follows.

<Calibration>

The test solution is put into the container. The test solution in the container is fed to the nozzle. Compressed air is fed into the nozzle to accelerate the test solution within the nozzle, and an arbitrary amount of the test solution is jetted perpendicularly onto an acrylic plate with a thickness of 2 mm through a jet hole at the tip of the nozzle. This causes the spherical silica in the test solution to collide with the acrylic plate. The cross-sectional shape of the nozzle is 1 mm×1 mm square, and the distance between the jet hole and the acrylic plate is 4 mm.

After an arbitrary amount of the test solution is jetted, the jetting of the test solution is temporarily stopped. After the jetting of the test solution is temporarily stopped, the cross-sectional profile of the acrylic plate where the spherical silica particles in the test solution have collided is measured.

The erosion rate (μm/g) of the acrylic plate is calculated by dividing the depth (μm) of the cross-sectional profile by the arbitrary amount (g).

If the erosion rate of the acrylic plate is within ±5% of 1.88 (μm/g) as a reference, the test is passed. Meanwhile, the flow rate of the test liquid or the compressed air, the pressure of the compressed air, and the pressure of the test liquid in the nozzle should be adjusted and calibrated so that the erosion rate of the acrylic plate is within the range.

The test solution used in the calibration should be the same as the test solution used in the measurement conditions to be implemented later.

The measurement instrument used in the calibration should be the same as the measurement instrument used in the measurement conditions to be implemented later.

The difference between the calibration and the measurement conditions to be implemented later is, for example, the use of a 2 mm-thick acrylic plate as a standard sample in the calibration, whereas a plastic film is used as a sample in the measurement conditions.

The standard sample, an acrylic plate of 2-mm thickness, is preferably a polymethyl methacrylate plate. The acrylic sheet with a thickness of 2 mm as a standard sample preferably has an AcE of 1.786 μm/g or more and 1.974 μm/g or less, when AcE is defined as the average erosion rate of acrylic sheet measured under the following measurement conditions A. Here, examples of the spherical silica under the following measurement conditions A is model number "MSE-BS-5-3" designated by Palmeso Co., Ltd. Examples of the spherical silica corresponding the model number "MSE-BS-5-3" designated by Palmeso Co., Ltd. include the product number "BS5-3" of Potters-Ballotini Co., Ltd.

<Measurement Conditions A>

A test solution is prepared by mixing pure water, a dispersant, and spherical silica with an average particle size within ±8% of 4.2 μm at a mass ratio of 968:2:30, and is then put into a container. The test solution in the container is fed to a nozzle. Compressed air is fed into the nozzle to accelerate the test solution within the nozzle, and a predetermined amount of the test solution is jetted perpendicularly onto the acrylic plate through a jet hole at the tip of the nozzle. This causes the spherical silica in the test solution to collide with the acrylic plate. The cross-sectional shape of the nozzle is 1 mm×1 mm square, and the distance between the jet hole and the acrylic plate is 4 mm. Meanwhile, the flow rate of the test liquid or the compressed air supplied to the nozzle, the pressure of the compressed air, and the pressure of the test liquid in the nozzle is provided such that the flow rate of the test liquid is 100 ml/min or more and 150 ml/min or less, the flow rate of the compressed air is 4.96 L/min or more and 7.44 L/min or less, the pressure of the compressed air is 0.184 MPa or more and 0.277 MPa or less, and the pressure of the test liquid in the nozzle is 0.169 MPa or more and 0.254 MPa or less.

After 4 g of the test solution is jetted, the jetting of the test solution is temporarily stopped.

After the jetting of the test solution is temporarily stopped, the cross-sectional profile of the acrylic plate where the spherical silica particles in the test solution have collided is measured.

The erosion rate AcE of the acrylic plate is calculated by dividing the depth (μm) of the cross-sectional profile by 4 g, which is the amount of the test solution jetted. The unit of AcE is "μm/g".

If the erosion rate of the acrylic plate during calibration is within ±5% of 1.88 (μm/g) as a reference, the test is passed. Meanwhile, the flow rate of the test liquid or the compressed air, the pressure of the compressed air, and the pressure of the test liquid in the nozzle should be adjusted for implementation so that the erosion rate of the acrylic plate is within the range.

Note that the wording "the erosion rate is within ±5% of 1.88 (μm/g) as a reference" means, in other words, that the erosion rate is 1.786 (μm/g) or more and 1.974 (μm/g) or less.

<Condition 6>

For each of the 30 small samples, at the center of the region of 30 mm×40 mm, the erosion rate from a surface of the plastic film that constitutes the sample to a depth of 20 μm is measured. Here, $\sigma_{0-20}$ is defined as the variation of the erosion rate as calculated from the erosion rate from a surface of the plastic film that constitutes each sample to a depth of 20 μm. At that time, the percentage of small samples in which the $\sigma_{0-20}/E_{0-20}$ is 0.100 or less, among the 30 small samples is 50% or more.

As used herein, $\sigma_{0-20}$ can be calculated from the erosion rate for each cycle until the depth of the cross-sectional profile reaches 20 μm under the above measurement conditions.

Here, $\sigma_{0-20}/E_{0-20}$ indicates the coefficient of variation of the erosion rate, and a small value of $\sigma_{0-20}/E_{0-20}$ means that the erosion rate is less likely to vary in the thickness direction of the plastic film. By setting $\sigma_{0-20}/E_{0-20}$ to 0.100 or less, the erosion rate in the thickness direction is stabilized and better pencil hardness can be easily obtained.

In addition, by setting $\sigma_{0-20}/E_{0-20}$ to 0.100 or less, the film quality in the thickness direction of the plastic film can be made uniform. That the film quality in the thickness direction of the plastic film is uniform leads to the plastic film, by itself, with a uniform film quality. The uniformity of film quality in the plastic film thickness direction may be low, or it may be difficult to stably form a functional layer on the plastic film. Thus, if condition 6 is met, the quality of an optical laminate with a functional layer on the plastic film is likely to improve.

Out of 30 small samples, the percentage of small samples with $\sigma_{0-20}/E_{0-20}$ of 0.100 or less is preferably 70% or more, more preferably 90% or more, and still more preferably 100%.

In condition 6, the upper limit of $\sigma_{0-20}/E_{0-20}$ is more preferably 0.080 or less, still more preferably 0.070 or less, still more preferably 0.060 or less, and still more preferably 0.055 or less.

The smaller the value of $\sigma_{0-20}/E_{0-20}$, the more uniform the film quality of the plastic film in the thickness direction. When the film quality in the thickness direction of the plastic film is uniform, stress tends to propagate easily in the thickness direction. Thus, $\sigma_{0-20}/E_{0-20}$ is preferably 0.020 or more and more preferably 0.035 or more.

Examples of the embodiment of the preferred numerical range of $\sigma_{0-20}/E_{0-20}$ include 0.020 or more and 0.100 or less, 0.020 or more and 0.080 or less, 0.020 or more and 0.070 or less, 0.020 or more and 0.060 or less, 0.020 or more and 0.055 or less, 0.035 or more and 0.100 or less, 0.035 or more and 0.080 or less, 0.035 or more and 0.070 or less, 0.035 or more and 0.060 or less, or 0.035 or more and 0.055 or less.

In order to keep the erosion rate of plastic film within the above range, it is desirable to stretch the molecules evenly within the plane of the plastic film.

The plastic film may be produced, for example, by general-purpose sequential biaxial stretching. In sequential biaxial stretching in the flow direction, the erosion rate tends to decrease as the stretching time is shortened and to increase as the stretching time is extended. The reason for this is thought to be that a short stretching time makes it difficult for the molecules to be stretched evenly in the plane of the plastic film, while a long stretching time makes it easier for the molecules to be stretched evenly in the plane of the plastic film. In other words, to obtain $E_{0-20}$ of 1.4 µm/g or more, it is desirable to increase the stretching time. Further, it is easier to achieve an $E_{0-20}$ of 1.4 µm/g or more by increasing the stretching time while suitably increasing the stretching ratio to the extent that the physical properties do not vary.

<Relationship Between Width Direction and Slow Axis of Plastic Film>

The optical plastic film preferably be highly oriented in the entire width direction. A highly oriented state in the entire width direction of the plastic film means that the fluctuation of the slow axis in the entire width direction is 24.0 degrees or less in a 1000-mm wide plastic film. The fluctuation means half of the difference between the minimum and the maximum of the angle of the slow axis in the entire width direction.

In the general-purpose biaxially stretched optical plastic films such as PET with a thickness of 15 µm or more and 100 µm or less, a bowing phenomenon causes an increase in the fluctuation of the slow axis in the entire width direction of the plastic film. Specifically, the fluctuation of the slow axis in the entire width direction of a general-purpose biaxially stretched optical plastic film with a width of 1000 mm is nearly 30.0 degrees (condition 2 of the optical plastic film of the present disclosure is characterized by the variation of the slow axis in the narrow region of 30 mm×40 mm; on the other hand, the fluctuation of the slow axis in the entire width direction of the plastic film differs in that it specifies the fluctuation of the slow axis in a wide region).

The fluctuation of the slow axis in the entire width direction of the plastic film is set to 24.0 degrees or less. This makes it easier to suppress variation in physical properties such as pencil hardness in the width direction of the plastic film. The above fluctuation is more preferably 20.0 degrees or less and still more preferably 17.0 degrees or less.

Note that if the fluctuation is too small, the plastic film may not be sufficiently biaxially stretched. For this reason, the fluctuation is preferably 4.0 degrees or more, more preferably 6.0 degrees or more, and still more preferably 8.0 degrees or more.

The slope of the slow axis of the optical plastic film relative to the width direction or flow direction is preferably 24.0 degrees or less and more preferably 20.0 degrees or less. When cut out from a large plastic film, each rectangular plastic film is often cut along the width and flow directions of the large plastic film. The smaller the slope of the slow axis relative to the width direction of the plastic film, the smaller the difference between the width direction of the cut plastic film and the direction of the slow axis of the plastic film. This is likely to stabilize optical properties of the optical plastic film when applied to an image display device. Note that in order to suppress blackout more easily, a technique to increase the slope of the slow axis relative to the width direction of the plastic film is also being considered. However, the optical plastic film of the present disclosure makes it possible to suppress blackout by satisfying condition 2. Due to this, it is unnecessary to increase the slope of the slow axis relative to the width direction of the plastic film.

The slow axis of the plastic film may be measured as "orientation angle (degrees)" using, for example, the product name "RETS-100", manufactured by OTSUKA ELECTRONICS CO., LTD.

<Plastic Film>

Examples of the lamination structure of the plastic film include a monolayer structure or a multilayer structure. Of these, a monolayer structure is preferred.

The plastic film preferably be a stretched plastic film with a small in-plane phase difference to suppress rainbow unevenness while maintaining favorable mechanical strength. In order to reduce the in-plane phase difference of a stretched plastic film, fine stretching control is important in which the stretching in the flow direction and the stretching in the width direction are made closer to be equal. The monolayer structure is preferred because the physical properties in the thickness direction are almost uniform and fine stretching control is implemented easier than in the multilayer structure.

Examples of the resin component constituting the plastic film include polyester, triacetyl cellulose (TAC), cellulose diacetate, cellulose acetate butyrate, polyamide, polyimide, polyethersulfone, polysulfone, polypropylene, polymethylpentene, poly(vinyl chloride), poly(vinyl acetal), poly(ether ketone), poly(methyl methacrylate), polycarbonate, polyurethane, or amorphous olefin (Cyclo-Olefin-Polymer: COP). Among them, polyester is preferred because it is easy to obtain good mechanical strength and pencil hardness. In other words, the optical plastic film is preferably a polyester film.

In the polyester film, as described above, it is easy to obtain, for instance, favorable pencil hardness. Thus, the polyester film can be suitably used as a surface material for image display devices.

On the other hand, a polycarbonate film or amorphous olefin film, by itself, frequently has low pencil hardness of B or less. Accordingly, in order to improve the pencil hardness of the polycarbonate film or amorphous olefin film, it is essential to make the film thicker, provide a very thick functional layer, or even cover it with a sputtered film, or make a devise. Thus, the polycarbonate film or amorphous olefin film has disadvantages of the film becoming thicker when the pencil hardness is increased, etc. Therefore, it is difficult to use the film as a surface material for image display devices.

In addition, it is possible to use, as the resin constituting the plastic film, a resin, in which optical isotropy is easily given, such as triacetyl cellulose, cyclo-olefin-based resin, or polymethyl methacrylate. This is considered to reduce the in-plane phase difference as much as possible even for the stretched plastic film. However, it is difficult to control the manufacturing conditions of stretched plastic film using triacetyl cellulose, cyclo-olefin resin-based resin, or polymethyl methacrylate. Thus, it tends to be difficult to adjust the optical properties, such as the in-plane phase difference and the range of the slow axis variation, to the desirable range of optical properties of the optical plastic film of the present disclosure.

Examples of the polyester constituting the polyester film include polyethylene terephthalate (PET), polyethylene naphthalate (PEN), or polybutylene terephthalate (PBT). Among them, PET is preferred because of its low intrinsic birefringence and low in-plane phase difference.

The plastic film optionally contains additives such as a UV absorber, a light stabilizer, an antioxidant, an antistatic agent, a flame retardant, an anti-gelling agent, and/or a surfactant.

In order to improve the mechanical strength, the thickness of the plastic film is preferably 10 µm or more, more preferably 20 µm or more still more preferably 25 µm or more, and still more preferably 30 µm or more.

In order to improve the bending resistance and make it easier to satisfy condition 1, the thickness of the plastic film is preferably 75 μm or less, more preferably 60 μm or less, still more preferably 55 μm or less, and still more preferably 50 μm or less.

Examples of the embodiment of the range of the thickness of the plastic film include 10 μm or more and 75 μm or less, 10 μm or more and 60 μm or less, 10 μm or more and 55 μm or less, 10 μm or more and 50 μm or less, 20 μm or more and 75 μm or less, 20 μm or more and 60 μm or less, 20 μm or more and 55 um or less, 20 μm or more and 50 μm or less, 25 μm or more and 75 μm or less, 25 um or more and 60 μm or less, 25 μm or more and 55 μm or less, 25 μm or more and 50 μm or less, 30 μm or more and 75 μm or less, 30 μm or more and 60 μm or less, 30 μm or more and 55 μm or less, or 30 μm or more and 50 μm or less.

The optical plastic film has a JIS K7136:2000 haze of preferably 3.0% or less, more preferably 2.0% or less, and still more preferably 1.0% or less.

The optical plastic film has a JIS K7361-1:1997 total light transmittance of preferably 80% or more, more preferably 85% or more, and still more preferably 90% or more.

The plastic film is preferably a stretched plastic film and more preferably a stretched polyester film to improve the mechanical strength and pencil hardness. Further, it is more preferable that the stretched polyester film has a monolayer structure of polyester resin layer.

The stretched plastic film may be obtained by stretching a resin layer containing components that constitute the plastic film. Examples of the stretching technique include biaxial stretching (e.g., sequential or simultaneous biaxial stretching) or uniaxial stretching (e.g., longitudinal uniaxial stretching). Among them, biaxial stretching is preferred because it is easier to lower the in-plane phase difference and to increase the mechanical strength and pencil hardness. In other words, the stretched plastic film is preferably a biaxially stretched plastic film. Among the biaxially stretched plastic films, a biaxially stretched polyester film is preferred, and a biaxially stretched polyethylene terephthalate film is more preferred.

Sequential Biaxial Stretching

In sequential biaxial stretching, a casting film is stretched in the flow direction followed by stretching in the width direction of the film.

The stretching in the flow direction is usually implemented by varying the peripheral speed of the stretching roll(s) and may be implemented in one step or in multiple steps using multiple pairs of stretching rolls. In order to suppress excessive variation in optical properties such as the in-plane phase difference, it is preferable to have multiple nip rolls in close proximity to the stretching rolls. The stretching ratio in the flow direction is usually 2 times or more and 15 times or less. In order to suppress excessive variation in optical properties such as the in-plane phase difference, the stretching ratio in the flow direction is preferably 2 times or more and 7 times or less, more preferably 3 times or more and 5 times or less, and still more preferably 3 times or more and 4 times or less.

The stretching temperature is preferably at the glass transition temperature or more of the resin and at the glass transition temperature +100° C. or less to prevent excessive variation in optical properties such as the in-plane phase difference. For PET, preferred is 70° C. or more and 120° C. or less, more preferred is 80° C. or more and 110° C. or less, and still more preferred is 95° C. or more and 110° C. or less. The temperature of the film may be rapidly increased to shorten the section stretched at low temperatures. This tends to make smaller the average of the in-plane phase difference.

At the time of heating during stretching or cooling after stretching, it is preferable to blow turbulence-containing air against the film. Blowing the turbulence-containing air causes a temperature difference in a minute region within the film surface. Further, the temperature difference facilitates the occurrence of minute misalignment in the orientation axis, making it easier to satisfy condition 2.

The film stretched in the flow direction may be given functions such as better lubricity, better adhesiveness, and antistatic properties by in-line coating. Also, surface treatment such as corona treatment, flame treatment, or plasma treatment may be optionally applied prior to the in-line coating.

Thus, the coating film formed by in-line coating is very thin and has a thickness of 10 nm or more and 2000 nm or less. This coating film is further stretched thinner by the stretching treatment. Such a thin layer is herein not counted as the number of layers constituting the plastic film.

The stretching in the width direction is usually performed using the tenter method, in which both ends of the film are gripped with clips and the film is stretched in the width direction while being conveyed. The stretching ratio in the width direction is usually 2 times or more and 15 times or less. The stretching ratio in the width direction is preferably 2 times or more and 5 times or less, more preferably 3 times or more and 5 times or less, and still more preferably 3 times or more and 4.5 times or less in order to suppress excessive variation in optical properties such as the in-plane phase difference. In addition, it is preferable that the stretching ratio in the width direction is higher than the stretching ratio in the flow direction.

The stretching temperature preferably be at the glass transition temperature or more of the resin and at the glass transition temperature +120° C. or less. The temperature preferably increase from upstream to downstream. Specifically, when the stretching section in the width direction is divided into two parts, the difference between the upstream and downstream temperatures is preferably 20° C. or more, more preferably 30° C. or more, still more preferably 35° C. or more, and still more preferably 40° C. or more. For PET, the stretching temperature at the first step is preferably 80° C. or more and 120° C. or less, more preferably 90° C. or more and 110° C. or less, and still more preferably 95° C. or more and 105° C. or less.

The sequentially biaxially stretched film as so obtained preferably be heat-treated at the stretching temperature or more and less than the melting point in a tenter in order to provide flatness and dimensional stability. Specifically, for PET, heat fixation is performed in the range preferably 150° C. or more and 255° C. or less and more preferably 200° C. or more and 250° C. or less. In addition, in order to suppress excessive variation in optical properties such as the in-plane phase difference, it is preferable to additionally perform stretching of 1% or more and 10% or less in the first half of heat treatment.

After the sequential biaxial stretching and before the above heat treatment, it is preferable to cool the plastic film with turbulence-containing air. The cooling step causes a temperature difference in a minute region within the film surface. Further, the temperature difference facilitates the occurrence of minute misalignment in the orientation axis, making it easier to satisfy condition 2.

The plastic film is heat-treated, slowly cooled to room temperature, and then rolled up. In addition, the plastic film is optionally subjected to relaxation or other treatment used in combination with heat treatment or slow cooling. The relaxation rate during heat treatment is preferably 0.5% or more and 5% or less, more preferably 0.5% or more and 3% or less, still more preferably 0.8% or more and 2.5% or less, and still more preferably 1% or more and 2% or less to suppress excessive variation in optical properties such as the in-plane phase difference. In addition, the relaxation rate during slow cooling is preferably 0.5% or more and 3% or less, more preferably 0.5% or more and 2% or less, still more preferably 0.5% or more and 1.5% or less, and still more preferably 0.5% or more and 1.0% or less to suppress excessive variation in optical properties such as the in-plane phase difference. The temperature during slow cooling is preferably 80° C. or more and 150° C. or less, more preferably 90° C. or more and 130° C. or less, and still more preferably 100° C. or more and 130° C. or less, and still more preferably 100° C. or more and 120° C. or less to improve the flatness.

Simultaneous Biaxial Stretching

In simultaneous biaxial stretching, a casting film is guided to a simultaneous biaxial tenter, where it is conveyed while clipped at both ends and stretched simultaneously and/or stepwise in the flow and width directions. Examples of the simultaneous biaxial stretching machine include a pantograph type, screw type, drive motor type, or linear motor type machine. Preferred is a drive motor type or linear motor type machine that can perform the relaxation process at any location and can change the stretching ratio optionally.

The simultaneous biaxially stretching ratio as an area ratio is usually 6 times or more and 50 times or less, preferably 8 times or more and 30 times or less, more preferably 9 times or more and 25 times or less, still more preferably 9 times or more and 20 times or less, and still more preferably 10 times or more and 15 times or less in order to suppress excessive variation in optical properties such as the in-plane phase difference.

In addition, in the case of simultaneous biaxial stretching, it is preferable that the stretching ratios in the flow and width directions are the same and that the stretching speed is almost equal in order to suppress the in-plane orientation difference.

The stretching temperature for simultaneous biaxial stretching is preferably at the glass transition temperature or more of the resin and at the glass transition temperature +120° C. or less to prevent excessive variation in optical properties such as the in-plane phase difference. For PET, preferred is from 80° C. or more and 160° C. or less, more preferred is from 90° C. or more and 150° C. or less, and still more preferred is from 100° C. or more and 140° C. or less.

The simultaneously biaxially stretched film preferably be subsequently heat-treated at the stretching temperature or more and less than the melting point in a heat fixing chamber in a tenter in order to provide flatness and dimensional stability. The heat treatment conditions described above are the same as the heat treatment conditions after the sequential biaxial stretching.

<Size>

The optical plastic film may be in a sheet-like form cut to a predetermined size or in a roll-like form in which a long sheet is wound like a roll. The size of sheet is not particularly limited, but the maximum diameter should be about 14.2 inches or more and 500 inches or less. The "maximum diameter" refers to the maximum length of the optical plastic film when any two points are connected. For example, if the optical plastic film is rectangular, the diagonal of the rect-angle is the maximum diameter. If the optical plastic film is circular, the diameter of the circle is the maximum diameter.

The width and length of the roll are not particularly limited, but generally the width is 300 mm or more and 9000 mm or less, and the length is 100 m or more and 5000 m or less. The roll-shaped optical plastic film may be cut into single sheets according to the size of image display device, and then used. It is preferable to exclude, during cutting, roll edges where the properties are unstable.

The shape of sheet is not particularly limited, and may be, for instance, polygonal such as triangular, quadrangular and pentagonal or circular, or a random irregular shape.

<Applications>

The optical plastic film of the present disclosure can be suitably used as a plastic film for an image display device.

Here, as described above, in the plastic film of the present disclosure, it is possible to prevent a bending habit from remaining after a bending test or prevent a break regardless of the bending direction. Thus, it can be used more suitably as a plastic film for a foldable image display device, a rollable image display device, or an image display device with a curved surface.

The optical plastic film of the present disclosure can be suitably used as a plastic film disposed on the light-emitting surface side of display element in the image display device. At that time, it is preferable to have a polarizer between the display element and the optical plastic film of the present disclosure.

Examples of the plastic film for an image display device include a plastic film used as a base material for various functional films (e.g., a polarizer protection film, a surface protection film, an anti-reflection film, a conductive film that constitutes a touch panel).

Optical Laminate

The optical laminate of the present disclosure has a functional layer on the optical plastic film of the present disclosure described above.

The functional layer includes one or more layers selected from a hard coating layer, an antireflection layer, an antiglare layer, a phase difference layer, an adhesive layer, a transparent conductive layer, an antistatic layer, or an antifouling layer. Among the functional layers mentioned above, the phase difference layer, represented by the liquid crystal layer, tends to have weak physical properties such as pencil hardness and, moreover, insufficient light resistance. Thus, when the optical laminate has a phase difference layer, it is preferable to arrange the optical laminate such that the phase difference layer side of the optical laminate faces the display element side relative to the plastic film in the image display device.

The functional layer of the optical laminate preferably includes an antireflection layer. The antireflection layer preferably be disposed on the topmost surface on the side of the plastic film with the functional layer.

Inclusion of an antireflection layer as a functional layer of the optical laminate can further suppress rainbow unevenness.

When the optical plastic film included in the optical laminate of the present disclosure satisfies the prescribed suitable conditions as described above, the pencil hardness is easily made better. Accordingly, the optical laminate of the present disclosure can also easily achieve favorable pencil hardness. Thus, the optical laminate of the present disclosure can be suitably used as a surface material for image display devices. In the case where the optical laminate of the present disclosure is used as a surface material of an image display device, the optical laminate should not have a phase difference layer as a functional layer on the viewing side.

It is more preferable for the functional layer to include a hard coating layer and an antireflection layer. When the functional layer includes a hard coating layer and an antireflection layer, the hard coating layer 41 and the antireflection layer 42 is preferably arranged in this order on the plastic film 10 (FIG. 3). In the case where the functional layer includes a hard coating layer and an antireflection layer, the suitability as a surface material for image display devices can be enhanced.

Examples of the antireflection layer include: a monolayer structure of a low-refractive-index layer; a bilayer structure of a high-refractive-index layer and a low-refractive-index layer; or a multilayer structure structured by three or more layers.

The low-refractive-index layer preferably be disposed on the topmost surface on the side of the plastic film with the functional layer.

The lower limit of the refractive index of the low-refractive-index layer is preferably 1.10 or more, more preferably 1.20 or more, still more preferably 1.26 or more, still more preferably 1.28 or more, and still more preferably 1.30 or more, and the upper limit is preferably 1.48 or less, more preferably 1.45 or less, still more preferably 1.40 or less, still more preferably 1.38 or less, and still more preferably 1.32 or less.

Examples of the embodiment of the range of refractive index of the low-refractive-index layer include 1.10 or more and 1.48 or less, 1.10 or more and 1.45 or less, 1.10 or more and 1.40 or less, 1.10 or more and 1.38 or less, 1.10 or more and 1.32 or less, 1.20 or more and 1.48 or less, 1.20 or more and 1.45 or less, 1.20 or more and 1.40 or less, 1.20 or more and 1.38 or less, 1.20 or more and 1.32 or less, 1.26 or more and 1.48 or less, 1.26 or more and 1.45 or less, 1.26 or more and 1.40 or less, 1.26 or more and 1.38 or less, 1.26 or more and 1.32 or less, 1.28 or more and 1.48 or less, 1.28 or more and 1.45 or less, 1.28 or more and 1.40 or less, 1.28 or more and 1.38 or less, 1.28 or more and 1.32 or less, 1.30 or more and 1.48 or less, 1.30 or more and 1.45 or less, 1.30 or more and 1.40 or less, 1.30 or more and 1.38 or less, or 1.30 or more and 1.32 or less.

As used herein, the refractive index of each layer constituting the antireflection layer such as a low-refractive-index layer and a high-refractive-index layer means the value at a wavelength of 589.3 nm.

The lower limit of the thickness of the low-refractive-index layer is preferably 80 nm or more, more preferably 85 nm or more, and still more preferably 90 nm or more, and the upper limit is preferably 150 nm or less, more preferably 110 nm or less, and still more preferably 105 nm or less.

Examples of the embodiment of the range of thickness of the low-refractive-index layer include 80 nm or more and 150 nm or less, 80 nm or more and 110 nm or less, 80 nm or more and 105 nm or less, 85 nm or more and 150 nm or less, 85 nm or more and 110 nm or less, 85 nm or more and 105 nm or less, 90 nm or more and 150 nm or less, 90 nm or more and 110 nm or less, or 90 nm or more and 105 nm or less.

The method of forming the low-refractive-index layer may be roughly classified into wet and dry methods. Examples of the wet method include a formation method using a sol-gel process with metal alkoxide, etc., a formation method applying a resin with a low refractive index such as a fluororesin, or a formation method applying a coating liquid for forming a low refractive index layer, which liquid contains low-refractive-index particles in a resin composition. Examples of the dry method include physical vapor deposition or chemical vapor deposition to form a low-refractive-index layer. Examples of the material include $SiO_2$, $SiO_x$ (x=1 or more and 2 or less), or $MgF_2$.

The wet method is superior to the dry method in terms of production efficiency, suppression of oblique reflection hue, and chemical resistance. In this embodiment, among the wet methods, it is preferable to use a coating liquid for forming a low-refractive-index layer, which liquid contains low-refractive-index particles in a binder resin composition for the sake of adhesion, water resistance, scratch resistance, and low refractive index. In other words, the low-refractive-index layer preferably contain a binder resin and low-refractive-index particles.

The binder resin of the low-refractive index layer preferably includes a cured product of a curable resin composition. The percentage of the cured product of a curable resin composition with respect to the total binder resin in the low refractive index layer is preferably 50% by mass or more, more preferably 70% by mass or more, still more preferably 90% by mass or more, and most preferably 100% by mass.

Examples of the curable resin composition for the low-refractive-index layer include a thermosetting resin composition or a ionizing radiation curable resin composition. The curable resin composition such as a thermosetting resin composition or an ionizing radiation curable resin composition used may be a general-purpose composition.

The low-refractive-index particles preferably include one or more kinds selected from hollow or non-hollow particles. For the balance between low reflection and scratch resistance, it is preferable to use one or more particles selected from hollow particles in combination with one or more particles selected from non-hollow particles.

The material for the hollow or non-hollow particles may be any of an inorganic or organic compound such as silica or magnesium fluoride. However, silica is preferred because of its lower refractive index and strength. Specifically, the low-refractive-index layer preferably contains hollow silica particles and non-hollow silica particles as low-refractive-index particles.

In consideration of the optical properties and the mechanical strength, the lower limit of the average particle size of the hollow particles is preferably 50 nm or more, and more preferably 60 nm or more and the upper limit is preferably 100 nm or less, and more preferably 80 nm or less. Examples of the embodiment of the range of average particle size of hollow particles include 50 nm or more and 100 nm or less, 50 nm or more and 80 nm or less, 60 nm or more and 100 nm or less, or 60 nm or more and 80 nm or less.

In consideration of the dispersibility while the non-hollow particles are prevented from agglomeration, the lower limit of the average particle size of the non-hollow particles is preferably 5 nm or more, and more preferably 10 nm or more and the upper limit is preferably 20 nm or less, and more preferably 15 nm or less. Examples of the embodiment of the range of average particle size of non-hollow particles include 5 nm or more and 20 nm or less, 5 nm or more and 15 nm or less, 10 nm or more and 20 nm or less, or 10 nm or more and 15 nm or less.

The higher the content of hollow particles, the higher the filling ratio of hollow particles in the binder resin, and the lower the refractive index of the low-refractive-index layer. Thus, the content of hollow particles is preferably 100 parts by mass or more and more preferably 150 parts by mass or more based on 100 parts by mass of the binder resin.

On the other hand, if the content of hollow particles in the binder resin is too large, the number of hollow particles exposed from the binder resin increases. In addition, the amount of binder resin used to bond the particles is less. This tends to reduce the mechanical strength of the low-refractive-index layer, such as scratch resistance. Thus, the content of hollow particles is preferably 400 parts by mass or less and more preferably 300 parts by mass or less based on 100 parts by mass of the binder resin.

Examples of the embodiment of the range of content of hollow particles based on 100 parts by mass of the binder resin include: 100 parts by mass or more and 400 parts by mass or less, 100 parts by mass or more and 300 parts by mass or less, 150 parts by mass or more and 400 parts by mass or less, or 150 parts by mass or more and 300 parts by mass or less.

In the case of small content of non-hollow particles, the presence of non-hollow particles on the surface of the low-refractive-index layer may not affect the hardness increase. On the other hand, when the content of the non-hollow silica particles increases, the influence of shrinkage unevenness caused by polymerization of the binder resin can be reduced. This reduces roughness that occurs on the surface of the low-refractive-index layer after resin curing, and also makes it easier to further improve scratch resistance. Thus, the content of non-hollow particles is preferably 10 parts by mass or more, more preferably 50 parts by mass or more, still more preferably 70 parts by mass or more, and still more preferably 100 parts by mass or more based on 100 parts by mass of the binder resin.

On the other hand, if the content of non-hollow particles is too large, the surface roughness becomes large because the non-hollow particles tend to aggregate and caused shrinkage unevenness of the binder resin. Thus, the content of non-hollow particles is preferably 200 parts by mass or less and more preferably 150 parts by mass or less based on 100 parts by mass of the binder resin.

Examples of the range of content of hollow particles based on 100 parts by mass of the binder resin include: 10 parts by mass or more and 200 parts by mass or less, 10 parts by mass or more and 150 parts by mass or less, 50 parts by mass or more and 200 parts by mass or less, 50 parts by mass or more and 150 parts by mass or less, 70 parts by mass or more and 200 parts by mass or less, 70 parts by mass or more and 150 parts by mass or less, 100 parts by mass or more and 200 parts by mass or less, or 100 parts by mass or more and 150 parts by mass or less.

The high-refractive-index layer preferably be disposed on the plastic film side relative to the low-refractive-index layer. In the case of having a hard coating layer as described below, the high-refractive-index layer is preferably formed between the hard coating layer and the low-refractive-index layer.

The lower limit of the refractive index of the high-refractive-index layer is preferably 1.53 or more, more preferably 1.54 or more, still more preferably 1.55 or more, and still more preferably 1.56 or more, and the upper limit is preferably 1.85 or less, more preferably 1.80 or less, still more preferably 1.75 or less, and still more preferably 1.70 or less.

Examples of the embodiment of the range of refractive index of the high-refractive-index layer include 1.53 or more and 1.85 or less, 1.53 or more and 1.80 or less, 1.53 or more and 1.75 or less, 1.53 or more and 1.70 or less, 1.54 or more and 1.85 or less, 1.54 or more and 1.80 or less, 1.54 or more and 1.75 or less, 1.54 or more and 1.70 or less, 1.55 or more and 1.85 or less, 1.55 or more and 1.80 or less, 1.55 or more and 1.75 or less, 1.55 or more and 1.70 or less, 1.56 or more and 1.85 or less, 1.56 or more and 1.80 or less, 1.56 or more and 1.75 or less, or 1.56 or more and 1.70 or less.

The upper limit of the thickness of the high-refractive-index layer is preferably 200 nm or less, more preferably 180 nm or less, and still more preferably 150 nm or less, and the lower limit is preferably 50 nm or more, and more preferably 70 nm or more.

Examples of the embodiment of the range of thickness of the high-refractive-index layer include 200 nm or less, 50 nm or more and 200 nm or less, 50 nm or more and 180 nm or less, 50 nm or more and 150 nm or less, 70 nm or more and 200 nm or less, 70 nm or more and 180 nm or less, or 70 nm or more and 150 nm or less.

The case of a hard coating layer with a high refractive index preferably conforms to the thickness of the hard coating layer.

The high-refractive-index layer may be formed, for example, from a coating liquid for forming a high refractive index layer, which liquid contains a binder resin composition and high refractive index particles. Specifically, the high-refractive-index layer preferably contain a binder resin and high-refractive-index particles.

The binder resin of the high-refractive index layer preferably includes a cured product of a curable resin composition. The percentage of the cured product of a curable resin composition with respect to the total binder resin in the high refractive index layer is preferably 50% by mass or more, more preferably 70% by mass or more, still more preferably 90% by mass or more, and most preferably 100% by mass.

Examples of the curable resin composition of the high-refractive-index layer include a thermosetting resin composition or a ionizing radiation curable resin composition. The curable resin composition such as a thermosetting resin composition or an ionizing radiation curable resin composition used may be a general-purpose composition.

Examples of the high-refractive-index particles include particles made of antimony pentoxide (refractive index: about 1.79), zinc oxide (refractive index: about 1.90), titanium oxide (refractive index: about 2.3 or more and 2.7 or less), cerium oxide (refractive index: about 1.95), tin doped indium oxide (refractive index: about 1.95 or more and 2.00 or less), antimony-doped tin oxide (refractive index: about 1.75 or more and 1.85 or less), yttrium oxide (refractive index: about 1.87), or zirconium oxide (refractive index: about 2.10).

The average particle size of the high-refractive-index particles is preferably 2 nm or more, more preferably 5 nm or more, and still more preferably 10 nm or more. In addition, the average particle size of the high-refractive-index particles is preferably 200 nm or less, more preferably 100 nm or less, still more preferably 80 nm or less, still more preferably 60 nm or less, and still more preferably 30 nm or less to transparency and suppress whitening.

Examples of the embodiment of the range of average particle size of the high-refractive-index particles include 2 nm or more and 200 nm or less, 2 nm or more and 100 nm or less, 2 nm or more and 80 nm or less, 2 nm or more and 60 nm or less, 2 nm or more and 30 nm or less, 5 nm or more and 200 nm or less, 5 nm or more and 100 nm or less, 5 nm or more and 80 nm or less, 5 nm or more and 60 nm or less, 5 nm or more and 30 nm or less, 10 nm or more and 200 nm or less, 10 nm or more and 100 nm or less, 10 nm or more and 80 nm or less, 10 nm or more and 60 nm or less, or 10 nm or more and 30 nm or less.

The average particle size of high- or low-refractive-index particles may be calculated by the following procedures (y1) to (y3).

(y1) Image a cross section of the high- or low-refractive-index layer by STEM. The acceleration voltage of the STEM preferably be 10 kV or more and 30 kV or less, and the magnification preferably be from 50,000× to 300,000×. Examples of a commercially available STEM include a Hitachi High-Technologies Corporation's field emission scanning electron microscope, "product number: S-4800".

(y2) Calculate the particle sizes of individual particles after randomly extracting 10 particles from the observed image. Each particle size is measured as the distance between the two straight lines combined such that the distance between the two lines is the maximum when the cross section of the particle is interposed between any two parallel lines. In the case of agglomerated particles, the agglomerated particles are considered as one particle for measurement.

(y3) After performing the same procedure five times on different observation images of the same sample, define the value obtained from the number-averaged particle size for a total of 50 particles as the average particle size of the high- or low-refractive-index particles.

The hard coating layer preferably contains as its main component a cured product of a curable resin composition such as a thermosetting resin composition or an ionizing radiation curable resin composition. The curable resin composition such as a thermosetting resin composition or an ionizing radiation curable resin composition used may be a general-purpose composition.

The main component means 50% by mass or more of the resin component constituting the hard coating layer, preferably 70% by mass or more, and more preferably 90% by mass or more.

The lower limit of the thickness of the hard coating layer is preferably 0.5 µm or more, more preferably 1 µm or more and the upper limit is preferably 30 µm or less, and more preferably 10 µm or less.

Examples of the embodiment of the range of thickness of the hard coating layer include: 0.5 µm or more and 30 µm or less, 0.5 µm or more and 10 µm or less, 1 µm or more and 30 µm or less, or 1 µm or more and 10 µm or less.

<Size>

The optical laminate may be in a sheet-like form cut to a predetermined size or in a roll-like form in which a long sheet is wound like a roll. The size of sheet is not particularly limited, but the maximum diameter should be about 14.2 inches or more and 500 inches or less. The "maximum diameter" refers to the maximum length of the optical laminate when any two points are connected. For example, if the optical laminate is rectangular, the diagonal of the rectangle is the maximum diameter. If the optical laminate is circular, the diameter of the circle is the maximum diameter.

The width and length of the roll are not particularly limited, but generally the width is 300 mm or more and 9000 mm or less, and the length is 100 m or more and 5000 m or less. The roll-shaped optical laminate may be cut into single sheets according to the size of image display device, and then used. It is preferable to exclude, during cutting, roll edges where the properties are unstable.

The shape of sheet is not particularly limited, and may be, for instance, polygonal such as triangular, quadrangular and pentagonal or circular, or a random irregular shape.

Polarization Plate

The polarization plate in the present disclosure includes: a polarizer; a first transparent protective plate disposed on one side of the polarizer; and a second transparent protective plate disposed on the other side of the polarizer, wherein at least one selected from the group consisting of the first transparent protective plate and the second transparent protective plate is the above-described optical plastic film of the present disclosure.

The polarization plate is used to provide antireflective properties by combining, for instance, the polarization plate and a λ/4 phase difference plate. In this case, the λ/4 phase difference plate is disposed on the display element of the image display device, and the polarization plate is disposed on the viewer's side of the display device relative to the λ/4 phase difference plate.

In the case of using the polarization plate for a liquid crystal display device, the polarization plate is used to provide a liquid crystal shutter function. In this case, the liquid crystal display device is arranged in the order of a lower polarization plate, a liquid crystal display element, and an upper polarization plate. Here, the absorption axis of polarizer of the lower polarization plate and the absorption axis of polarizer of the upper polarization plate are arranged orthogonally. In the above configuration, it is preferable to use the polarization plate in the present disclosure as the upper polarization plate.

<Transparent Protective Plate>

The polarization plate in the present disclosure includes an optical plastic film of the present disclosure described above as at least one selected from the group consisting of the first transparent protective plate and the second transparent protective plate. A preferred embodiment is that the first and second transparent protective plates each include an optical plastic film of the present disclosure as described above.

In the case where one of the first transparent protective plate or the second transparent protective plate includes an optical plastic film of the present disclosure as described above, the other transparent protective plate is not particularly limited, but an optically isotropic transparent protective plate is preferred.

As used herein, the optical isotropy refers to an in-plane phase difference of 20 nm or less, preferably 10 nm or less, and more preferably 5 nm or less. An acrylic or triacetyl cellulose (TAC) film tends to make optical isotropy.

When one of the first transparent protective plate or the second transparent protective plate includes an optical plastic film of the present disclosure as described above, the transparent protective plate on the light-emitting side preferably includes the above-described optical plastic film of the present disclosure.

The polarization plate in the present disclosure preferably includes the above-described optical laminate of the present disclosure used as at least one selected from the group consisting of the first transparent protective plate and the second transparent protective plate.

<Polarizer>

Examples of the polarizer include a sheet-type polarizer such as a polyvinyl alcohol film, a polyvinyl formal film, a polyvinyl acetal film, and an ethylene-vinyl acetate copolymer-based saponified film which are dyed with iodine or the like and are stretched, a wire grid-type polarizer formed from a large number of metal wires arranged in parallel, a coating-type polarizer coated with a lyotropic liquid crystal or a dichroic guest-host material, and a multilayer thin film-type polarizer. Such a polarizer may be a reflection-type polarizer having a function of reflecting a non-transmission polarizing component.

The angle formed between the direction of the absorption axis of the polarizer and the average direction of the slow axis of the optical plastic film is not particularly limited, but is preferably arranged so that they are substantially parallel or perpendicular to each other. As used herein, the term "substantially parallel" means within 0 degrees±5 degrees, preferably within 0 degrees±3 degrees, and more preferably within 0 degrees±1 degree. As used herein, the term "substantially perpendicular" means within 90 degrees±5 degrees, preferably within 90 degrees±3 degrees, and more preferably within 90 degrees±1 degree. Usually, it is difficult to suppress blackout when the angles formed by the direction of the absorption axis of the polarizer and the direction of the slow axis of the optical plastic film are substantially parallel or perpendicular to each other. However, the polarization plate in the present disclosure uses an optical plastic film of the present disclosure. This can suppress blackout even if the above angles are substantially parallel or perpendicular to each other. In addition, by making the above angles substantially parallel or perpendicular, it can be made easier to improve the yield of the polarizer or the optical plastic film.

<Size>

The polarization plate may be in a sheet-like form cut to a predetermined size or in a roll-like form in which a long sheet is wound like a roll. The size of sheet is not particularly limited, but the maximum diameter should be about 14.2 inches or more and 500 inches or less. The "maximum diameter" refers to the maximum length of the polarization plate when any two points are connected. For example, if the polarization plate is rectangular, the diagonal of the rectangle is the maximum diameter. If the polarization plate is circular, the diameter of the circle is the maximum diameter.

The width and length of the roll are not particularly limited, but generally the width is 300 mm or more and 9000 mm or less, and the length is 100 m or more and 5000 m or less. The roll-shaped polarization plate may be cut into single sheets according to the size of image display device, and then used. It is preferable to exclude, during cutting, roll edges where the properties are unstable.

The shape of sheet is not particularly limited, and may be, for instance, polygonal such as triangular, quadrangular and pentagonal or circular, or a random irregular shape.

Image Display Device

The image display device of the present disclosure includes a display element and a plastic film disposed on the light emitting surface side of the display element, wherein the plastic film is the above-described optical plastic film of the present disclosure.

FIGS. 3 and 4 are each a cross-sectional view of an embodiment of image display device 100 in the present disclosure.

Each image display device 100 shown in FIGS. 3 and 4 has an optical plastic film 10 on the light emitting side of a display element 20. The upper side of FIGS. 3 and 4 is the light emitting side of the display element. Each image display device 100 shown in FIGS. 3 and 4 has a polarizer 31 between the display element 20 and the optical plastic film 10. In FIGS. 3 and 4, a first transparent protective plate (32) and a second transparent protective plate (33) are layered on both sides of the polarizer 31. In the image display device shown in FIG. 4, the optical plastic film 10 is used as the first transparent protective plate (32).

A polarizer may be disposed between the display element and the optical plastic film. In this case, the angle formed between the direction of the absorption axis of the polarizer and the average direction of the slow axis of the optical plastic film is not particularly limited, but is preferably arranged so that they are substantially parallel or perpendicular to each other.

The image display device 100 is not limited to the forms shown in FIGS. 3 and 4. For example, in FIGS. 3 and 4, the respective members constituting the image display device 100 are arranged at predetermined intervals. However, the respective members may be integrated by means of an adhesive layer or other means. The image display device may have another member(s) (not shown).

<Display Element>

Examples of the display element include a liquid crystal display element, an EL display element such as an organic EL display element and an inorganic EL display element, or a plasma display element. Further examples include an LED display element such as a micro-LED display element and a mini-LED display element.

When the display element of display device is a liquid crystal display element, a backlight is required on a surface on the side opposite to a resin sheet of the liquid crystal display element.

The display element with a wide color gamut is preferred. As described below, the display element with a wider color gamut has respective sharper RGB optical spectra. And if the optical spectral shapes of the display element are sharp, it is difficult to suppress rainbow unevenness by the method of increasing the in-plane phase difference. The optical plastic film of the present disclosure has a small in-plane phase difference and is thus preferable because it is easy to suppress rainbow unevenness even in the case of the display element with a wide color gamut.

The color gamut that can be reproduced by mixing the three RGB colors is indicated by a triangle on the CIE-xy chromaticity diagram. The triangle is formed by defining the coordinates of the vertices of each RGB color and connecting each vertex.

The RGB optical spectra may each be sharp. In this case, in the CIE-xy chromaticity diagram, the R vertex coordinate has a larger x value and a smaller y value, the G vertex coordinate has a smaller x value and a larger y value, and the B vertex coordinate has a smaller x value and a smaller y value. In other words, when the RGB optical spectra are each sharp, the area of the triangle obtained by connecting the vertex coordinates of respective RGB colors on the CIE-xy chromaticity diagram becomes larger, and the color gamut that can be reproduced becomes wider. Then, the wider color gamut also results in an improvement in the power and realism of moving images.

The color gamut is standardized by, for instance, "ITU-R Recommendation BT.2020-2 (hereinafter referred to as "BT.2020-2")". ITU-R stands for "International Telecommunication Union - Radiocommunication Sector" and ITU-R Recommendation BT.2020-2, is an international standard for the Super Hi-Vision color gamut revised in October 2015. When the BT.2020-2 coverage based on the CIE-xy chromaticity diagram expressed in the following formula is within the range described below, it can be made easier to improve the power and realism of moving images.

<Formula Representing BT.2020-2 Coverage>

[Area that is of the CIE-xy chromaticity diagram of light emitted from the display device and that overlaps with the area of the CIE-xy chromaticity diagram of BT.2020-2/Area of the CIE-xy chromaticity diagram of BT.2020-2]×100 (%).

The "Area of the CIE-xy chromaticity diagram of light emitted from the display device" required to calculate the BT.2020-2 coverage is obtained by measuring the respective x and y values in the CIE-Yxy color system for red, green, and blue displays, and calculating the area from the "red vertex coordinate", the "green vertex coordinate", and the "blue vertex coordinate" obtained from the above measurement results. The x and y values in the CIE-Yxy color system may be measured, for example, with a Konica Minolta CS-2000 spectroradiometer.

The display element has a BT.2020-2 coverage, as calculated using the above formula, of preferably 60% or more and more preferably 65% or more. The optical plastic film of this disclosure has a small in-plane phase difference, and is thus preferable because rainbow unevenness is easily suppressed even if the BT.2020-2 coverage of the display device is 60% or more.

The image display device may be an image display device with a touch panel function.

Examples of the touch panel include a resistive film-type, electrostatic capacitance-type, electromagnetic induction-type, infrared-type, or ultrasonic-type touch panel.

The touch panel function may be a function added within the display element, such as an in-cell touch panel LCD display element, or a touch panel disposed on the display element.

As described above, in the optical plastic film of the present disclosure, it is possible to prevent a bending habit from remaining after a bending test or prevent a break. For this reason, the image display device of the present disclosure is preferable because a remarkable effect can be exerted in the case of a foldable type image display device (foldable image display device), a rollable type image display device (rollable image display device in which a curved shape can be changed to a flat shape), or a curve-shaped image display device.

When the image display device is a foldable type image display device, a rollable type image display device, or a curve-shaped image display device, the display element is preferably an organic EL display element.

<Plastic Film>

The image display device of the present disclosure is provided, on the light-emitting surface side of the display element, with the above-described optical plastic film of the present disclosure. In the image display device, there may be only one or two or more optical plastic films of the present disclosure.

Examples of the optical plastic film disposed on the light-emitting surface side of the display element include an optical plastic film used as a base material for various functional films (e.g., a polarizer protection film, a surface protection film, a antireflection film, a conductive film that constitutes a touch panel).

<Other Plastic Film>

The image display device of the present disclosure may have another plastic film(s) to the extent that they do not interfere with the effects of the present disclosure. The other plastic film refers to a plastic film that does not meet the conditions of the optical plastic film of the present disclosure.

The other plastic film is preferably a optically isotropic film. As used herein, the optical isotropy means an in-plane phase difference of 20 nm or less.

<Size>

The size of image display device is not particularly limited, but the maximum diameter should be about 14.2 inches or more and 500 inches or less. The "maximum diameter" refers to the maximum length of the image display device when any two points are connected. For example, if the image display device is rectangular, the diagonal of the rectangle is the maximum diameter. If the image display device is circular, the diameter of the circle is the maximum diameter.

The shape of image display device is not particularly limited, and may be, for instance, polygonal such as triangular, quadrangular and pentagonal or circular, or a random irregular shape.

Examples

Next, the present disclosure is further described in detail with Examples, but the present discloser is no way limited to these Examples.

1. Measurement and Evaluation

The atmosphere for the following measurements and evaluations should be at a temperature of 23° C.±5° C. and a relative humidity of 40% or more and 65% or less. In addition, samples should be exposed to the above atmosphere for 30 minutes or more before each measurement and evaluation. In addition, each sample should be sampled from a location free of any defects in the optical plastic film or the functional layer.

1-1. In-Plane Phase Difference (Re) and Direction of Slow Axis

Seven large samples of 200 mm in the flow direction×300 mm in the width direction were cut out from a roll-like optical plastic film with a width of 2,100 mm, as prepared in Examples 1 to 10 or Comparative Example 6 of section "2" described below. The large sample at the center in the width direction was sample 1 of each Example; the first large sample on the right side relative to the center in the width direction was sample 2 of each Example; the second large sample on the right side relative to the center in the width direction was sample 3 of each Example; and the third large sample on the right side relative to the center in the width direction was sample 4 of each Example. Each optical plastic film can be said to have almost equal physical properties at symmetrical positions with respect to the center of the film in the width direction. Therefore, the measurement on the left side relative to the center in the width direction was omitted. Provided that only samples 2 to 3 were collected for Example 4, samples 1 to 3 for Example 5, sample 1 for Examples 7 to 9, samples 1 to 2 for Example 10, and samples 1 to 2 for Comparative Example 6.

Measurement samples were obtained by cutting 30 small samples of 40 mm×50 mm from each of the 4 large samples: samples 1 to 4.

On the other hand, one large sample of 200 mm×300 mm was cut out from the optical plastic film, as prepared in Comparative Examples 1 to 5 of section "2" described below. Measurement samples were obtained by cutting 30 small samples of 40 mm×50 mm from the large sample.

Next, the in-plane phase difference and the angle of slow axis were measured within a region of 30 mm×40 mm obtained by excluding 5 mm from each edge of each 40 mm×50 mm measurement sample in each Example or Comparative Example. The measurement instrument used was Photonic Lattice's "WPA-200-L (trade name)". The measurement conditions, etc., were as follows. This measurement makes it possible to measure the in-plane phase difference and the angle of slow axis in each of 47,000 or more regions obtained by subdividing the region of 30 mm×40 mm.

Based on the measurement results, the average of the in-plane phase difference and the standard deviation σ of the angle of slow axis were calculated for each of the 30 small samples constituting the large sample. Thereafter, whether or not each large sample satisfied conditions 1 to 2 was determined. Each sample satisfying the conditions was graded as "A" and each sample not satisfying the conditions was graded as "C". Table 1 or 2 shows the results.

An average of the 30 small samples were calculated based on the average of the in-plane phase difference, the standard deviation σ of the in-plane phase difference, and the standard deviation σ of the angle of slow axis as calculated from each of the small samples. Table 3 shows the results.

Note that in the trade name "WPA-200-L" from Photonic Lattice, the in-plane phase difference of 3000 nm or more cannot be measured. Due to this, for the measurement samples in Comparative Example 5, only the standard deviation σ of the angle of slow axis was measured using the trade name "WPA-200-L" from Photonic Lattice. The in-plane phase difference of each measurement sample in Comparative Example 5 was measured at the in-plane center of the sample by using the trade name "RETS-100" manufactured by OTSUKA ELECTRONICS CO., LTD.

<WPA-200-L Specifications>
Number of birefringent pixels: 384×288 pixels
Lens: Standard lens (f1.25)

<Measurement Steps>
(1) Turn on the instrument, start up the software (WPA-view), and wait at least 30 minutes to allow it to stabilize.
(2) After placing a measurement sample on the light source stage, adjust the height of camera unit so that the measurement sample fits within an area where the light source stage is projected in the camera preview window. At that time, the measurement sample should not float off the light source stage. Also, visually check that no ambient light enters the preview window. The area in the camera preview window where the light source stage is projected is subdivided into 384×288 pixels (110,592 pixels). Note that in the camera preview window, the above adjustment preferably be made so that there is a small distance between the outer edge of the measurement sample and the outer edge of the area where the light source stage is projected. The above distance preferably be about 3 mm in actual dimension.
(3) While turning the dial on the lens, focus on the measurement sample. During the measurement in each Example, the dial was set to "4".
(4) In the user settings, set the conditions below. The baseline is then measured after the measurement sample is temporarily removed. The baseline measurement is conducted for each sample.
(5) After rearranging the sample, perform the measurement.
(6) After selecting a region on the analysis screen where the actual area of the sample corresponds to 30 mm×40 mm, calculate the average of the in-plane phase difference, the standard deviation σ of the in-plane phase difference, and the standard deviation σ of the angle of slow axis.

<User Settings>
In the user settings, check the following items.
Auto Exposure Adjustment: Auto exposure adjustment is carried out during measurement.
Noise filter: Automatically applied
Masking of dark areas: Masking is performed (10.0%)
Axis direction setting: Slow axis
Measuring accuracy: High accuracy
Measurement mode: Measurement at three wavelengths
Material coefficient: Automatic 1-2. Phase Difference in Thickness Direction (Rth)

Next, the phase difference in the thickness direction was measured at the center of a region of 30 mm×40 mm obtained by excluding 5 mm from each edge of each of 30 measurement samples of 40 mm×50 mm in each Example or Comparative Example as prepared in the section 1-1. The measurement instrument used was the trade name "RETS-100" manufactured by OTSUKA ELECTRONICS CO., LTD.

Based on the measured results, whether or not each large sample satisfied condition 3 was determined. Each sample satisfying the condition was graded as "A" and each sample not satisfying the condition was graded as "C". Table 1 or 2 shows the results.

An average of the 30 small samples were calculated based on the phase difference in the thickness direction as calculated from each small sample. Table 3 shows the results.

1-3. Erosion Rate

The erosion rate from a surface of the plastic film constituting the sample to a depth of 20 μm was measured at the center of the region of 30 mm×40 mm obtained by excluding 5 mm from each edge of the 30 measurement samples of 40 mm×50 nm from each Example or Comparative Example as prepared in the section 1-1. Then, the erosion rates obtained were used to calculate $E_{0-20}$ as the average erosion rate from a surface of the plastic film constituting the sample to a depth of 20 μm. The method for measuring the erosion rate was implemented in accordance with the main text of this specification.

Based on the measured results, whether or not each large sample satisfied condition 5 was determined. Each sample satisfying the condition was graded as "A" and each sample not satisfying the condition was graded as "C". Table 1 or 2 shows the results.

1-4. Rainbow Unevenness 1 (Plastic Film Only, Liquid Crystal Display Device with White LED as Light Source)

Large 200 mm×300 mm samples from each Example or Comparative Example as prepared in the section 1-1 were each placed on the polarization plate on the viewing side of the image display device 1 as configured below. The direction of the absorption axis of the polarizer in the viewing-side polarization plate and the average direction of the slow axis of each large sample were arranged in parallel to each other. Next, the image display system was turned on in a dark room environment, and each measurement sample was inspected from various angles along the slow axis of the measurement sample by naked eyes from a distance of about 1 meter. The following criteria were used to evaluate the presence or absence of rainbow unevenness. The evaluators were a total of 20 healthy individuals, five in each age group from the 20s to the 50s, with corrected visual acuity of 1.0 or more.

A: 16 or more evaluators answered that the rainbow unevenness was not visible.
B: 11 or more and 15 or less evaluators answered that the rainbow unevenness was not visible.
C: 10 or less evaluators answered that the rainbow unevenness was not visible.

<Configuration of Image Display Device 1>
(1) Backlight light source: White LED
(2) Display element: Liquid crystal display element with a color filter
(3) Polarization plate on the light source side: Having TAC films as protective films on both sides of the polarizer made of PVA and iodine. The polarizer is positioned so that the direction of the absorption axis is perpendicular to the horizontal direction of the screen.
(4) Image display cell: Liquid crystal cell
(5) Viewing-side polarization plate: Polarization plate in which a TAC film is used as a polarizer protection film for the polarizer made of PVA and iodine. The polarizer is positioned so that the direction of the absorption axis is parallel to the horizontal direction of the screen.
(6) Size: 21.5 inches diagonal The BT.2020-2 coverage based on the CIE-xy chromaticity diagram of the image display device 1 was 49%.

1-5. Rainbow Unevenness 2 (Plastic Film Only, Organic EL Display Device)

The rainbow unevenness was evaluated in the same manner as in the section 1-4, except that the image display device 1 was changed to an image display device 2 as shown below.

<Configuration of Image Display Device 2>
(1) Display element: Three-color independent organic EL display element with a microcavity structure
(2) Polarization plate on the light source side: None
(3) Viewing-side polarization plate: Polarization plate in which a TAC film is used as a polarizer protection film for the polarizer made of PVA and iodine. The polarizer is positioned so that the direction of the absorption axis is parallel to the horizontal direction of the screen.
(4) Size: 21.5 inches diagonal The BT.2020-2 coverage based on the CIE-xy chromaticity diagram of the image display device 2 was 77%.

1-6. Rainbow Unevenness 3 (Optical Laminate, Liquid Crystal Display Device With White LED as Light Source)

The rainbow unevenness was evaluated in the same manner as in the section 1-4, except that the plastic film of each Example or Comparative Example placed on the polarization plate on the viewing side was changed to the optical laminate of each Example or Comparative Example prepared in the section "3" below.

1-7. Rainbow Unevenness 4 (Optical Laminate, Organic EL Display Device)

The rainbow unevenness was evaluated in the same manner as in the section 1-5, except that the plastic film of each Example or Comparative Example placed on the polarization plate on the viewing side was changed to the optical laminate of each Example or Comparative Example prepared in the section "3" below.

1-8. Blackout 1 (Vertical Placement)

Large 200 mm×300 mm samples from each Example or Comparative Example as prepared in the section 1-1 were each placed on the polarization plate on the viewing side of the image display device 1 as configured in the section 1-4. Each sample was placed so that the average direction of the slow axis of the sample was perpendicular to the horizontal direction of the screen. In other words, the polarization plate on the viewing side was positioned so that the angle formed between the absorption axis of the polarizer and the average direction of the slow axis of the sample was 90 degrees.

Next, in the center portion of the image display device on which the sample was placed, three letters with a font size of 16 in Microsoft's product name "WORD (trademark)" were displayed at a display magnification of 100%, and were then viewed from the front through polarized sunglasses. The direction of the absorption axis of the polarized sunglasses during viewing was set to be orthogonal to the absorption axis of the polarizer of the viewing-side polarization plate. Three points were given when the letters were easily distinguished; two points were given when the letters might or might not be determined; and one point was given when the letters were not easily distinguished due to blackout. Here, a total of 20 subjects, five in each age group the 20s or more and the 50s or less, participated in the evaluation. The evaluations from the 20 evaluators were averaged and then ranked according to the following criteria. All the 20 subjects were healthy individuals with visual acuity of 1.0 or more. The visual acuity includes corrected visual acuity.

<Criteria>
AAA: Average score of 2.85 or more
AA: Average score of 2.70 or more and less than 2.85
A: Average score of 2.50 or more and less than 2.70
B: Average score of 2.00 or more and less than 2.50
C: Average score of 1.50 or more and less than 2.00
D: Average score of less than 1.50

1-9. Blackout 2 (45-Degree Placement)

Large 200 mm×300 mm samples from each Example or Comparative Example as prepared in the section 1-1 were each placed on the polarization plate on the viewing side of the image display device 1 as configured in the section 1-4. Each sample was placed so that the angle between the average direction of the slow axis of the sample and the horizontal direction of the screen was 45 degrees. In other words, the polarization plate on the viewing side was positioned so that the angle formed between the absorption axis of the polarizer and the average direction of the slow axis of the sample was 45 degrees.

Next, in the center portion of the image display device on which the sample was placed, three letters with a font size of 16 in Microsoft's product name "WORD (trademark)" were displayed at a display magnification of 100%, and then, the substantially the same procedure as in the section 1-8 was used for evaluation while the letters were viewed from the front through polarized sunglasses. The direction of the absorption axis of the polarized sunglasses during viewing was set to be orthogonal to the absorption axis of the polarizer of the viewing-side polarization plate.

1-10. Bending Resistance
<Slow Axis Direction>

From the center portion of a large 200 mm×300 mm sample from each of Examples 1 to 10 or Comparative Example 6 as prepared in the section 1-1, a sample strip of 30 mm in the width direction×100 mm in the flow direction was cut out. In the center portion of the optical plastic film in each of Examples 1 to 10 or Comparative Example 6, the width direction is generally directed to the average direction of the slow axis.

In addition, from the optical plastic film from each of Comparative Examples 1 to 5 as prepared in the below-described section "2", a sample strip of 30 mm in the slow axis direction×100 mm in the fast axis direction was cut out.

A continuous folding test was conducted 100,000 times by using a durability tester (product name "DLDMLH-FS", manufactured by YUASA SYSTEM Co., Ltd.), in which both ends of the sample on the short side were fixed and then folded 180 degrees. At both ends of the sample on the short side, each site 10 mm away from the tip of the sample was fixed. The folding speed was 120 times per minute. A more detailed protocol for the folding test is shown below.

After the folding test, the sample strip was placed on a leveled table. The bending resistance in the slow-axis direction was then evaluated by measuring the angle at which the edge of the sample lifted off the table. Table 1 or 2 shows the results. However, each sample that broke in the middle of the sample are indicated as "Break".

<Fast Axis Direction>

From the center portion of a large 200 mm×300 mm sample from each of Examples 1 to 10 or Comparative Example 6 as prepared in the section 1-1, a sample strip of 30 mm in the flow direction×100 mm in the width direction was cut out. In the center portion of the optical plastic film in each of Examples 1 to 10 or Comparative Example 6, the flow direction is generally directed to the average direction of the fast axis.

In addition, from the optical plastic film in each of Comparative Examples 1 to 5 as prepared in the below-described section "2", a sample strip of 30 mm in the fast axis direction×100 mm in the slow axis direction was cut out.

Each sample was likewise measured to evaluate their resistance to bending in the fast-axis direction.

<Details of Folding Test>

As shown in FIG. 5(A), during the continuous folding test, the edge 10C of the plastic film 10 and the edge 10D facing the edge 10C are each fixed to the corresponding parallelly disposed fixture 60 at the beginning. The fixtures 60 can be slidably moved in the horizontal direction.

Next, as shown in FIG. 5(B), the fixtures 60 are displaced so that they can be close to each other. This causes the plastic film 10 to be folded and deformed. Further, as shown in FIG. 5(C), the fixtures 60 are moved and positioned so that the distance between the two edges of the plastic film 10, which edges face to each other and are secured by the fixtures 60, is 10 mm. Afterwards, by moving the fixtures 60 in the opposite direction, the plastic film 10 deformation is eliminated.

As shown in FIGS. 5(A) to 5(C), the displacement of the fixtures 60 can cause the plastic film 10 to be folded 180 degrees. In addition, the continuous folding test is performed such that the bent portion 10E of the plastic film 10 does not protrude from the bottom edge of each fixture 60. Also, the distance between the fixtures 60 when they are closest to each other is controlled to 10 mm. By doing so, the distance between the two opposing edges of the optical film 10 can be 10 mm.

1-11. Pencil Hardness

As samples for the pencil hardness test, 30 measurement samples of 40 mm×50 mm from each Example or Comparative Example as prepared in the section 1-1 were provided. The samples were heated at 100° C. for 10 minutes. The pencil hardness test was conducted on each sample after heating. The pencil hardness test was conducted on a region of 30 mm×40 mm obtained by excluding 5 mm from each edge of the sample.

The pencil hardness test was performed based on the pencil hardness test specified in JIS K5600-5-4:1999, while the load, speed, and judgment conditions were changed from those specified in JIS. Specifically, the load and velocity were 100 g and 3 mm/s, respectively. After the load was applied to the heated sample, the sample was heated again at 100° C. for 10 minutes before any scratches were visually evaluated. The heated samples were then visually evaluated for scratches.

The requirement for passing the test was that the sample was not scratched at least three times out of five evaluations. For example, when the sample was not scratched 3 times or more out of 5 times at hardness 2B, the sample passed the test at hardness 2B, followed by the test at the next hardness.

Table 1 or 2 shows the pencil hardness of the sample in each Example or Comparative Example, as well as the number of times, out of five evaluations, that the sample was not scratched. In cases where the pencil hardness results of all the 30 samples were not identical, the pencil hardness of the worst evaluation result is shown in Table 1 or 2.

The acceptable level is that the sample is not scratched 3 times or more out of 5 evaluations at pencil hardness F. "AAA" was assigned when the sample was not scratched 5 times out of 5 evaluations at pencil hardness F; "AA" was assigned when the sample was not scratched 4 times out of 5 evaluations at pencil hardness F; "A" was assigned when the sample was not scratched 3 times out of 5 evaluations at pencil hardness F; and each sample that did not reach the acceptable level was assigned "C".

2. To Produce and Prepare Optical Plastic Film

Example 1

First, 1 kg of PET (melting point: 258° C.; absorption center wavelength: 320 nm) and 0.1 kg of UV absorber (2,2'-(1,4-phenylene)bis(4H-3,1-benzoxazinon-4-one)) were melt-mixed at 280° C. in a kneader to produce a pellet containing the UV absorber. The pellet and PET with a melting point of 258° C. were fed into a single screw extruder, melted and kneaded at 280° C., and extruded through a T-die to prepare a casting film by casting on a cast drum with a controlled surface temperature of 25° C. The amount of UV absorber in the casting film was 1 part by mass per 100 parts by mass of PET.

The resulting casting film was heated by a group of rolls set at 95° C. and then stretched 3.3 times in the flow direction while being heated by a radiation heater so that the film temperature at the 130-mm point in the 400-mm stretch section was 99° C. and the film temperature at the 150-mm point was 100° C. The film was then once cooled to obtain a uniaxially stretched film. The stretch section had a starting point with a stretching roll A and an ending point with a stretching roll B. The stretching rolls A and B each had two nip rolls. Note that during heating with the radiation heater, turbulence was created by blowing air at 80° C. and 5 m/s from behind the radiation heater toward the film, so that the temperature uniformity of the film was disturbed.

Next, corona discharge treatment was applied to both sides of the uniaxially stretched film in air to set the wetting tension of the base film to 55 mN/m. Next, the following lubricative layer coating liquid was in-line coated on the corona discharge treated surfaces on the both sides of the film to form each lubricative layer.

Next, the uniaxially stretched film was guided to a tenter, preheated with hot air at 95° C., and stretched 4.5 times in the film width direction at 105° C. in the first stage and 135° C. in the second stage. Here, when the stretch section in the width direction was divided into two sections, the film was stretched in two steps so that the amount of film stretch at the midpoint of the stretch section in the width direction was 80% of the amount of stretch at the end of the stretch section in the width direction. The "amount of stretch" mentioned above means the difference between the film width at the measurement point and the film width before stretching. The film stretched in the width direction was cooled by blowing turbulence-containing air of 5 m/s at 55° C. for about 2 seconds from the front and back sides of the film to disrupt the film temperature uniformity. Next, the film was heat-treated with hot air in a tenter. The temperature of the hot air was raised stepwise from 180° C. to 245° C. Subsequently, 1% relaxation treatment was applied in the width direction under the same temperature conditions. Further, the film was quickly cooled to 100° C., followed by another 1% relaxation treatment in the width direction. The film was then rolled up to obtain a biaxially stretched polyester film with a width of just over 2,100 mm, namely the optical plastic film in Example 1.

<Lubricative Layer Coating Liquid>

The coating liquid contained polyester resin with a glass transition temperature of 18° C., polyester resin with a glass transition temperature of 82° C., and silica particles with an average particle size of 100 nm.

Example 2

A biaxially stretched polyester film, the optical plastic film of Example 2, was produced by the same procedure as in Example 1, except that the film temperature at the 130-mm point of the casting film was changed to 97° C., the film temperature at the 150-mm point was changed to 98° C., and the temperature of turbulence-containing air blown against the film stretched in the width direction was changed to 60° C.

Example 3

A biaxially stretched polyester film, the optical plastic film of Example 3, was produced by the same procedure as in Example 2, except that the film temperature at the 130-mm point of the casting film was changed to 98° C.

Example 4

A biaxially stretched polyester film, the optical plastic film of Example 4, was produced by the same procedure as in Example 1, except that the film temperature at the 130-mm point of the casting film was changed to 98° C., the film temperature at the 150-mm point was changed to 105° C., the stretching ratio in the flow direction was changed to 3.9 times, and the temperature of turbulence-containing air blown against the film stretched in the width direction was changed to 60° C.

Example 5

A biaxially stretched polyester film, the optical plastic film of Example 5, was produced by the same procedure as in Example 1, except that the film temperature at the 130-mm point of the casting film was changed to 98° C., the film temperature at the 150-mm point was changed to 105° C., the stretching ratio in the flow direction was changed to 4.1 times, and the temperature of turbulence-containing air blown against the film stretched in the width direction was changed to 60° C.

Example 6

A biaxially stretched polyester film, the optical plastic film of Example 6, was produced by the same procedure as in Example 1, except that the film temperature at the 130-mm point of the casting film was changed to 98° C., the film temperature at the 150-mm point was changed to 110° C., the stretching ratio in the flow direction was changed to 3.5 times, the temperature of air blown from behind the radiation heater at the time of stretching in the flow direction was changed to 90° C., and the temperature of turbulence-containing air blown against the film stretched in the width direction was changed to 45° C.

Example 7

A biaxially stretched polyester film, the optical plastic film of Example 7, was produced by the same procedure as in Example 1, except that the film temperature at the 130-mm point of the casting film was changed to 95° C., the film temperature at the 150-mm point was changed to 99° C., the stretching ratio in the flow direction was changed to 3.1 times, the stretching ratio in the width direction was changed to 3.8 times, and the temperature of turbulence-containing air blown against the film stretched in the width direction was changed to 45° C.

Example 8

A biaxially stretched polyester film, the optical plastic film of Example 8, was produced by the same procedure as in Example 1, except that the film temperature at the 130-mm point of the casting film was changed to 98° C., the stretching ratio in the flow direction was changed to 3.9 times, and the temperature of turbulence-containing air blown against the film stretched in the width direction was changed to 55° C.

Example 9

A biaxially stretched polyester film, the optical plastic film of Example 9, was produced by the same procedure as in Example 1, except that the film temperature at the 130-mm point of the casting film was changed to 95° C., the film temperature at the 150-mm point was changed to 98° C., the stretching ratio in the flow direction was changed to 4.1 times, and the temperature of turbulence-containing air blown against the film stretched in the width direction was changed to 60° C.

Example 10

A biaxially stretched polyester film, the optical plastic film of Example 10, was produced by the same procedure as in Example 1, except that the film temperature at the 130-mm point of the casting film was changed to 102° C., the film temperature at the 150-mm point was changed to 110° C., the stretching ratio in the flow direction was changed to 3.0 times, the stretching ratio in the width direction was changed to 3.2 times, and the temperature of turbulence-containing air blown against the film stretched in the width direction was changed to 40° C.

Comparative Examples 1 to 5

The following plastic films were each prepared as an optical plastic film of each Comparative Example.

Comparative Example 1

Triacetyl cellulose film (product number: TD40; thickness: 40 μm, manufactured by FUJIFILM)

Comparative Example 2

Biaxially stretched polyester film (product name: Cosmoshine A4300; thickness: 38 μm, manufactured by Toyobo Co., Ltd.)

Comparative Example 3

Biaxially stretched polyester film (product name: Lumirror 50U403; thickness: 50 μm, manufactured by TORAY INDUSTRIES, INC.)

Comparative Example 4

Biaxially stretched polyester film (product name: DIAFOIL T600; thickness: 23 μm, manufactured by Mitsubishi Chemical Corporation)

Comparative Example 5

Uniaxially stretched polyester film (product name: Cosmoshine TA048; thickness: 80 μm, manufactured by Toyobo Co., Ltd.)

Comparative Example 6

A biaxially stretched polyester film, the optical plastic film of Comparative Example 6, was produced by the same procedure as in Example 1, except that the film temperature at the 130-mm point of the casting film was changed to 102° C., the film temperature at the 150-mm point was changed to 110° C., the stretching ratio in the flow direction was changed to 3.0 times, the stretching ratio in the width direction was changed to 3.2 times, the temperature of turbulence-containing air blown against the film stretched in the width direction was changed to 65° C., and air was not blown from behind the radiation heater at the time of stretching in the flow direction.

3. To Produce Optical Laminate

On the optical plastic film of each of Examples 1 to 10 or Comparative Examples 1 to 6, a hard coating layer-forming coating liquid of the following composition was applied, dried, and UV-irradiated to form a hard coating layer with a thickness of 5 μm. Next, on the hard coating layer, a low-refractive-index-layer-forming coating liquid of the following composition was applied, dried and UV irradiated to form a low-refractive-index layer with a thickness of 100 nm and a refractive index of 1.30. This resulted in each corresponding optical laminate of Examples 1 to 10 or Comparative Examples 1 to 6.

<Coating Liquid for Forming Hard Coating Layer>
- UV curable compound: 25.1 parts by mass (acrylic polymer; product name 8KX-077; manufactured by TAISEI FINE CHEMICAL CO., LTD.)
- UV curable compound: 25.4 parts by mass (polyfunctional acrylate; product name PET-30; manufactured by NIPPON KAYAKU Co., Ltd.)
- Photopolymerization initiator: 1.0 part by mass (product name "Omnirad 184"; IGM Resins B.V.)
- Silicone-based leveling agent: 0.30 parts by mass (product name TSF4460; manufactured by Momentive Performance Materials)
- Diluent: 37.4 parts by mass (a mixed solvent containing toluene, IPA, and PMA at a mass ratio of 47:33:20)

<Coating Liquid for Forming Low-Refractive-Index Layer>
- UV curable compound: 0.6 parts by mass (alkoxylated pentaerythritol acrylate with three or more and four or less functions; product name "NK Ester ATM-4PL"; manufactured by SHIN-NAKAMURA CHEMICAL CO, LTD.)
- Photopolymerization initiator: 0.1 parts by mass (product name "Omnirad 127"; IGM Resins B.V.)
- Hollow silica: 1.88 parts by mass (average particle size: 60 nm)
- Solid silica: 0.3 parts by mass (average particle size: 12 nm)
- Fluorinated antifouling agent: 1.16 parts by mass (product name "MEGAFACE F-568"; manufactured by DIC)
- Diluent: 92.7 parts by mass (a mixed solvent containing methyl isobutyl ketone and propylene glycol monomethyl ether acetate at a mass ratio of 90:10)

TABLE 1

| | | Condition 1 | | Condition 2 | | Condition 3 | | Condition 4 | | Condition 5 | |
|---|---|---|---|---|---|---|---|---|---|---|---|
| | | Percentage 1 [%] | Pass/Fail | Percentage 2 [%] | Pass/Fail | Percentage 3 [%] | Pass/Fail | Percentage 4 [%] | Pass/Fail | Percentage 5 [%] | Pass/Fail |
| Example 1 | S1 | 100 | A | 100 | A | 100 | A | 100 | A | 100 | A |
| | S2 | 100 | A | 100 | A | 100 | A | 100 | A | 100 | A |
| | S3 | 100 | A | 100 | A | 100 | A | 100 | A | 100 | A |
| | S4 | 100 | A | 100 | A | 100 | A | 100 | A | 100 | A |
| Example 2 | S1 | 100 | A | 100 | A | 100 | A | 100 | A | 100 | A |
| | S2 | 100 | A | 100 | A | 100 | A | 100 | A | 100 | A |
| | S3 | 100 | A | 100 | A | 100 | A | 100 | A | 100 | A |
| | S4 | 100 | A | 100 | A | 100 | A | 100 | A | 100 | A |
| Example 3 | S1 | 100 | A | 100 | A | 100 | A | 100 | A | 100 | A |
| | S2 | 100 | A | 100 | A | 100 | A | 100 | A | 100 | A |
| | S3 | 100 | A | 100 | A | 100 | A | 100 | A | 100 | A |
| | S4 | 100 | A | 100 | A | 100 | A | 100 | A | 100 | A |
| Example 4 | S2 | 72 | A | 75 | A | 100 | A | 94 | A | 95 | A |
| | S3 | 66 | A | 63 | A | 95 | A | 78 | A | 85 | A |
| Example 5 | S3 | 55 | A | 52 | A | 90 | A | 60 | A | 82 | A |
| | S2 | 85 | A | 100 | A | 100 | A | 100 | A | 95 | A |
| | S1 | 100 | A | 82 | A | 100 | A | 100 | A | 100 | A |

TABLE 1-continued

| | | Rainbow unevenness | | | | Blackout | | Bending resistance [unit: degrees] | | Pencil hardness | |
| --- | --- | --- | --- | --- | --- | --- | --- | --- | --- | --- | --- |
| | | | | | | | | Slow axis direction | Fast axis direction | | |
| | | 1 | 2 | 3 | 4 | 1 | 2 | | | | |
| Example 1 | S1 | A | A | A | A | AAA | AAA | 10 | 10 | F(5 times/5 times) | AAA |
| | S2 | A | A | A | A | AAA | AAA | 11 | 11 | F(5 times/5 times) | AAA |
| | S3 | A | A | A | A | AAA | AAA | 11 | 12 | F(5 times/5 times) | AAA |
| | S4 | B | B | A | A | AAA | AAA | 12 | 13 | F(5 times/5 times) | AAA |
| Example 2 | S1 | A | B | A | A | AA | AA | 14 | 17 | F(5 times/5 times) | AAA |
| | S2 | A | B | A | A | AA | AA | 14 | 16 | F(5 times/5 times) | AAA |
| | S3 | B | A | A | A | AA | AA | 15 | 17 | F(5 times/5 times) | AAA |
| | S4 | B | B | A | A | A | AA | 15 | 18 | F(5 times/5 times) | AAA |
| Example 3 | S1 | B | B | A | A | AA | AA | 14 | 17 | F(5 times/5 times) | AAA |
| | S2 | B | B | A | A | AA | AA | 15 | 17 | F(5 times/5 times) | AAA |
| | S3 | B | B | A | A | AA | AA | 15 | 17 | F(5 times/5 times) | AAA |
| | S4 | B | B | A | A | A | A | 15 | 18 | F(5 times/5 times) | AAA |
| Example 4 | S2 | B | B | A | A | AA | AA | 16 | 19 | F(5 times/5 times) | AAA |
| | S3 | B | B | A | A | A | A | 16 | 19 | F(4 times /5 times) | AA |
| Example 5 | S3 | B | B | A | A | A | A | 15 | 17 | F(4 times /5 times) | AA |
| | S2 | B | B | A | A | AA | AA | 14 | 16 | F(5 times/5 times) | AAA |
| | S1 | B | B | A | A | AA | AA | 14 | 15 | F(5 times/5 times) | AAA |

In Tables 1 and 2, percentages 1 to 5 mean the following percentages.

Percentage 1: Percentage of small samples with an average of the in-plane phase difference of 50 nm or more and 1,200 nm or less.

Percentage 2: Percentage of small samples with a standard deviation σ of 0.8 degrees or more for the angle of slow axis.

Percentage 3: Percentage of small samples with a phase difference of 2000 nm or more in the thickness direction.

Percentage 4: Percentage of small samples with a rate, as calculated as the average of the in-plane phase difference/the phase difference in the thickness direction, of 0.20 or less.

Percentage 5: Percentage of small samples with an $E_{0-20}$ of 1.4 μm/g or more.

In addition, in Tables 1 to 3, S1 denotes sample 1, S2 denotes sample 2, S3 denotes sample 3, and S4 denotes sample 4.

TABLE 2

| | | Condition 1 | | Condition 2 | | Condition 3 | | Condition 4 | | Condition 5 | |
| --- | --- | --- | --- | --- | --- | --- | --- | --- | --- | --- | --- |
| | | Percentage 1 [%] | Pass/Fail | Percentage 2 [%] | Pass/Fail | Percentage 3 [%] | Pass/Fail | Percentage 4 [%] | Pass/Fail | Percentage 5 [%] | Pass/Fail |
| Example 6 | S4 | 100 | A | 100 | A | 100 | A | 100 | A | 100 | A |
| | S3 | 100 | A | 100 | A | 100 | A | 100 | A | 100 | A |
| | S2 | 100 | A | 100 | A | 100 | A | 100 | A | 95 | A |
| | S1 | 100 | A | 100 | A | 100 | A | 100 | A | 90 | A |
| Example 7 | S1 | 95 | A | 100 | A | 100 | A | 100 | A | 85 | A |
| Example 8 | S1 | 100 | A | 100 | A | 100 | A | 100 | A | 100 | A |
| Example 9 | S1 | 100 | A | 100 | A | 100 | A | 100 | A | 100 | A |

TABLE 2-continued

| | | | | | | | | | | | |
|---|---|---|---|---|---|---|---|---|---|---|---|
| Example 10 | S1 | 60 | A | 100 | A | 100 | A | 100 | A | 55 | A |
| | S2 | 89 | A | 100 | A | 100 | A | 100 | A | 80 | A |
| Comparative Example 1 | | 0 | C | 100 | A | 0 | C | 100 | A | 30 | C |
| Comparative Example 2 | | 0 | C | 0 | C | 100 | A | 0 | C | 0 | C |
| Comparative Example 3 | | 0 | C | 10 | C | 100 | A | 0 | C | 0 | C |
| Comparative Example 4 | | 100 | A | 20 | C | 100 | A | 0 | C | 0 | C |
| Comparative Example 5 | | 0 | C | 0 | C | 100 | A | 0 | C | 0 | C |
| Comparative Example 6 | S1 | 40 | C | 43 | C | 100 | A | 0 | C | 40 | C |
| | S2 | 37 | C | 35 | C | 100 | A | 0 | C | 35 | C |

| | | Rainbow unevenness | | | | Blackout | | Bending resistance [unit: degrees] | | Pencil hardness | |
|---|---|---|---|---|---|---|---|---|---|---|---|
| | | | | | | | | Slow axis direction | Fast axis direction | | |
| | | 1 | 2 | 3 | 4 | 1 | 2 | | | | |
| Example 6 | S4 | A | A | A | A | AAA | AAA | 11 | 13 | F(4 times/5 times) | AA |
| | S3 | A | A | A | A | AAA | AAA | 12 | 12 | F(4 times/5 times) | AA |
| | S2 | A | A | A | A | AAA | AAA | 11 | 12 | F(3 times/5 times) | A |
| | S1 | A | A | A | A | AAA | AAA | 11 | 10 | F(3 times/5 times) | A |
| Example 7 | S1 | A | A | A | A | AAA | AAA | 14 | 16 | F(3 times/5 times) | A |
| Example 8 | S1 | A | A | A | A | AAA | AAA | 12 | 12 | F(5 times/5 times) | AAA |
| Example 9 | S1 | A | A | A | A | AA | AA | 11 | 12 | F(5 times/5 times) | AAA |
| Example 10 | S1 | A | B | A | A | AA | AA | 10 | 10 | F(3 times/5 times) | A |
| | S2 | A | B | A | A | AA | AA | 10 | 10 | F(3 times/5 times) | A |
| Comparative Example 1 | | A | A | A | A | C | C | — | — | 3B(4 times/5 times) | C |
| Comparative Example 2 | | C | C | C | C | C | A | 10 | 25 | 3B(5 times/5 times) | C |
| Comparative Example 3 | | C | C | C | C | B | A | 0 | 30 | 3B(5 times/5 times) | C |
| Comparative Example 4 | | C | C | C | C | C | A | — | — | 3B(5 times/5 times) | C |
| Comparative Example 5 | | A | C | A | C | D | AA | Break | 55 | 2B(5 times/5 times) | C |
| Comparative Example 6 | S1 | C | C | C | C | C | B | Break | 30 | 3B(5 times/5 times) | C |
| | S2 | C | C | C | C | C | B | Break | 25 | 3B(5 times/5 times) | C |

TABLE 3

| | | In-plane phase difference (Re) [unit: nm] | | Standard deviation σ of the angle of slow axis [unit: degrees] | Standard deviation 3σ of the angle of slow axis [unit: degrees] | Rth [unit: nm] | Average of Re/Rth |
|---|---|---|---|---|---|---|---|
| | | Average of Re | Standard deviation of Re | | | | |
| Example 1 | S1 | 309.8 | 24.8 | 4.8 | 14.4 | 6479.7 | 0.05 |
| | S2 | 397.5 | 21.7 | 3.1 | 9.3 | 6464.1 | 0.06 |
| | S3 | 470.5 | 16.8 | 1.7 | 5.1 | 6502.1 | 0.07 |
| | S4 | 570.3 | 21.2 | 1.9 | 5.7 | 6145.5 | 0.09 |
| Example 2 | S1 | 793.5 | 24.2 | 1.3 | 3.9 | 6659.2 | 0.12 |
| | S2 | 897.8 | 22.4 | 1.1 | 3.3 | 6517.1 | 0.14 |
| | S3 | 913.8 | 22.0 | 1.3 | 3.9 | 6958.6 | 0.13 |
| | S4 | 994.8 | 29.5 | 0.9 | 2.7 | 6878.2 | 0.14 |

TABLE 3-continued

|  |  | In-plane phase difference (Re) [unit: nm]. | | Standard deviation σ of the angle of slow axis [unit: degrees] | Standard deviation 3σ of the angle of slow axis [unit: degrees] | Rth [unit: nm] | Average of Re/Rth |
|---|---|---|---|---|---|---|---|
|  |  | Average of Re | Standard deviation of Re |  |  |  |  |
| Example 3 | S1 | 884.1 | 17.8 | 1.4 | 4.2 | 6654.1 | 0.13 |
|  | S2 | 920.3 | 25.6 | 1.0 | 3.1 | 6684.4 | 0.14 |
|  | S3 | 955.7 | 23.7 | 1.0 | 2.9 | 6608.0 | 0.14 |
|  | S4 | 1007.4 | 23.8 | 1.1 | 3.3 | 6533.7 | 0.15 |
| Example 4 | S2 | 1104.8 | 23.2 | 0.9 | 2.7 | 6120 | 0.18 |
|  | S3 | 1133.6 | 44.3 | 0.8 | 2.4 | 5873 | 0.19 |
| Example 5 | S3 | 950.0 | 25.8 | 0.8 | 2.4 | 4930.4 | 0.19 |
|  | S2 | 890.2 | 16.8 | 1.0 | 3.0 | 6389.7 | 0.14 |
|  | S1 | 785.9 | 24.3 | 1.1 | 3.3 | 6349.6 | 0.12 |
| Example 6 | S4 | 720.5 | 36.6 | 7.6 | 22.8 | 6547.9 | 0.11 |
|  | S3 | 634.2 | 34.3 | 10.2 | 30.6 | 6545.1 | 0.10 |
|  | S2 | 597.3 | 37.0 | 15.5 | 46.5 | 6983.7 | 0.09 |
|  | S1 | 341.9 | 39.2 | 19.0 | 57.0 | 6849.7 | 0.05 |
| Example 7 | S1 | 115.0 | 39.3 | 12.3 | 36.9 | 726.6 | 0.16 |
| Example 8 | S1 | 875.6 | 15.5 | 1.7 | 5.1 | 6785.2 | 0.13 |
| Example 9 | S1 | 925.4 | 24.0 | 0.7 | 2.1 | 6605 | 0.14 |
| Example 10 | S1 | 45 | 23.4 | 15.9 | 47.7 | 6100.1 | 0.01 |
|  | S2 | 90 | 21.6 | 16.6 | 49.8 | 6208.9 | 0.01 |
| Comparative Example 1 |  | 0.7 | 1.1 | 23.3 | 70.0 | 37.5 | 0.02 |
| Comparative Example 2 |  | 1365.4 | 16.2 | 0.5 | 1.5 | 4808.2 | 0.28 |
| Comparative Example 3 |  | 2220.2 | 11.9 | 0.8 | 2.3 | 8251.7 | 0.27 |
| Comparative Example 4 |  | 831.5 | 15.6 | 0.7 | 2.1 | 3695.8 | 0.22 |
| Comparative Example 5 |  | 10302.0 | — | 0.1 | 0.3 | 12045.0 | 0.86 |
| Comparative Example 6 | S1 | 1603.0 | 12.9 | 0.8 | 0.3 | 4984.0 | 0.32 |
|  | S2 | 1733.5 | 13.8 | 0.9 | 0.3 | 4608.4 | 0.38 |

The results of Tables 1 to 3 have demonstrated that the optical plastic film of each Example can be provided such that rainbow unevenness when viewed with naked eyes and blackout when viewed with polarized sunglasses can be suppressed without any axis alignment or increase in the in-plane phase difference. In addition, in the optical plastic film of each Example, it has also be demonstrated that a bending habit can be prevented from remaining after a bending test or a break can be prevented regardless of the bending direction.

Further, it can also be demonstrated that the optical plastic film of each Example has favorable pencil hardness because the erosion rate of condition 5 is met. In particular, in the optical plastic film in any of Examples 1 to 3, sample 2 in Example 4, sample 1 or 2 in Example 5, or Example 8 or 9, the percentage of small samples satisfying the erosion rate of condition 5 is 90% or more, and the σ of the angle of slow axis in condition 2 is not too large. Therefore, it can be verified that the pencil hardness is remarkable. The erosion rate of condition 5 is considered to increase the strength mainly in the thickness direction. This can make favorable the pencil hardness of the optical plastic film of each Example satisfying the erosion rate of condition 5. Among them, the pencil hardness can be made more favorable when the percentage of small samples satisfying the erosion rate of condition 5 is 90% or more. In addition, among the Examples, the optical plastic film from any of Examples 1 to 5 or 8 to 9 has a favorable in-plane orientation because the σ of the angle of slow axis in condition 2 is not too large. In other words, the optical plastic film from any of Examples 1 to 5 or 8 to 9, which film has a favorable in-plane orientation, has less variation in physical properties within the plane. This seems to make it easier to suppress the decrease in pencil hardness at a locally weak point as an origin. From these results, it is considered that, among the Examples, the optical plastic film from any of Examples 1 to 3, sample 2 in Example 4, sample 1 or 2 in Example 5, or Example 8 or 9 can achieve extremely good pencil hardness.

Incidentally, although not listed in the tables, the plastic films in Examples 1 to 10 satisfied condition 6 described in the main text of the present specification. Therefore, it can be concluded that the plastic films of Examples 1 to 10 have excellent film quality uniformity in the thickness direction and superior coating suitability.

REFERENCE SIGNS LIST

10: Optical plastic film
10a: Sheet-like optical plastic film
10b: Roll-like optical plastic film
20: Display element
30: Polarization plate
31: Polarizer
32: First transparent protective plate
33: Second transparent protective plate
40: Optical laminate
41: Hard coating layer
42: Antireflection layer
100: Image display device
110: Container
120: Receptor
210: Piping for test solution
220: Piping for compressed air
230: Return piping
310, 320: Flowmeter
410, 420: Pressure gauge
500: Jetting section 510: Nozzle
520: Housing
600: Cross-sectional profile acquisition unit
810: Sample mount
820: Support
900: Erosion rate measuring instrument
A1: Water
A2: Spherical silica
A3: Air
A4: Abraded plastic film

The invention claimed is:

1. An optical plastic film satisfying the following condition 1:

<Condition 1> when a large sample with a size of 200 mm×300 mm is cut out from a plastic film, the large sample is divided into 30 small samples of 40 mm×50 mm, a region of 30 mm×40 mm obtained by excluding 5 mm from each edge of each small sample is subdivided into 47,000 or more regions, and an in-plane phase difference of each subdivided region is then measured, a percentage of small samples in which an average of the in-plane phase difference of each region measured is 50 nm or more and 1,200 nm or less, among the 30 small samples is 50% or more.

2. An optical laminate comprising a functional layer on the optical plastic film according to claim 1.

3. The optical laminate according to claim 2, comprising an antireflection layer as the functional layer.

4. A polarization plate comprising: a polarizer; a first transparent protective plate disposed on one side of the polarizer; and a second transparent protective plate disposed on the other side of the polarizer, wherein at least one selected from the group consisting of the first transparent protective plate and the second transparent protective plate is the optical plastic film according to claim 1.

5. An image display device comprising a display element and a plastic film disposed on a light emitting surface side of the display element, wherein the plastic film is the optical plastic film according to claim 1.

6. The image display device according to claim 5, comprising a polarizer between the display element and the plastic film.

* * * * *